United States Patent
Iwabuchi

(10) Patent No.: US 7,528,811 B2
(45) Date of Patent: May 5, 2009

(54) SEMICONDUCTOR DISPLAY DEVICE AND ELECTRONIC APPLIANCE

(75) Inventor: Tomoyuki Iwabuchi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 595 days.

(21) Appl. No.: 11/156,920

(22) Filed: Jun. 20, 2005

(65) Prior Publication Data

US 2005/0285830 A1 Dec. 29, 2005

(30) Foreign Application Priority Data

Jun. 25, 2004 (JP) .............................. 2004-187757

(51) Int. Cl.
*G09G 3/30* (2006.01)
(52) U.S. Cl. ........................................ 345/77; 358/103
(58) Field of Classification Search ............. 345/76–83; 358/103

See application file for complete search history.

(56) References Cited

U.S. PATENT DOCUMENTS

| | | | | |
|---|---|---|---|---|
| 5,200,846 | A * | 4/1993 | Hiroki et al. ................. | 349/174 |
| 5,742,270 | A * | 4/1998 | Kuo ............................ | 345/100 |
| 6,252,574 | B1 * | 6/2001 | Hosoi et al. .................. | 345/103 |
| 6,727,875 | B1 * | 4/2004 | Mikami et al. ................ | 345/92 |
| 6,778,152 | B1 * | 8/2004 | Huang ......................... | 345/60 |
| 2003/0090447 | A1 * | 5/2003 | Kimura ........................ | 345/82 |
| 2003/0193585 | A1 * | 10/2003 | Ogura et al. ................. | 348/272 |
| 2003/0197472 | A1 * | 10/2003 | Kanauchi et al. .......... | 315/169.1 |
| 2004/0041754 | A1 * | 3/2004 | Inukai .......................... | 345/76 |
| 2004/0207331 | A1 * | 10/2004 | Koyama .................. | 315/169.3 |
| 2004/0227764 | A1 * | 11/2004 | Endo ........................... | 345/534 |

OTHER PUBLICATIONS

Tatsuo Uchida, Heiju Uchiike, Yukio Shimura, Flat-Panel Display Comprehensive Dictionary, first edition, Japan, published by Kogyo Chosakai Publishing Inc., Dec. 25, 2001, p. 456. (English translation of abstract).

* cited by examiner

*Primary Examiner*—Amare Mengistu
*Assistant Examiner*—Vinh T Lam
(74) *Attorney, Agent, or Firm*—Cook Alex Ltd.

(57) ABSTRACT

A semiconductor display device which can suppress the drive frequency while increasing the number of gray scales. According to the semiconductor display device, a plurality of pixels can be selected per row by a first scan line driver circuit, the plurality of pixels can be selected per row by a second scan line driver circuit, writing of a first video signal to the row selected by the first scan line driver circuit is controlled by a signal line driver circuit, writing of a second video signal to the row selected by the second scan line driver circuit is controlled by the signal line driver circuit, and using respective selection circuits included in the first and second scan line driver circuits, the output from the second scan line driver circuit to the plurality of pixels can be set at high impedance while the row is selected by the first scan line driver circuit, or the output from the first scan line driver circuit to the plurality of pixels can be set at high impedance while the row is selected by the second scan line driver circuit.

22 Claims, 14 Drawing Sheets

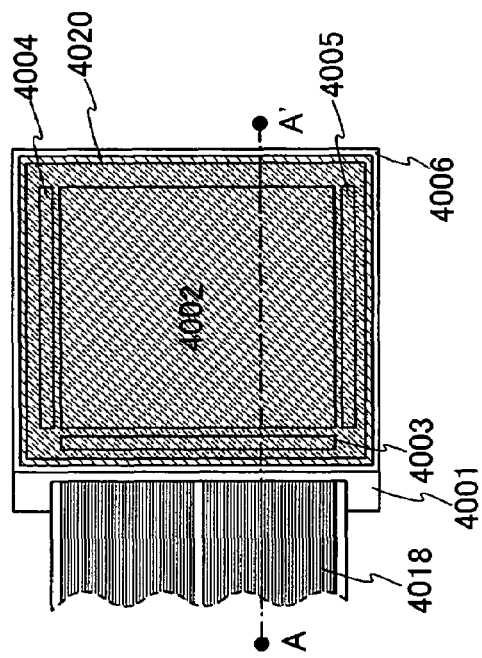
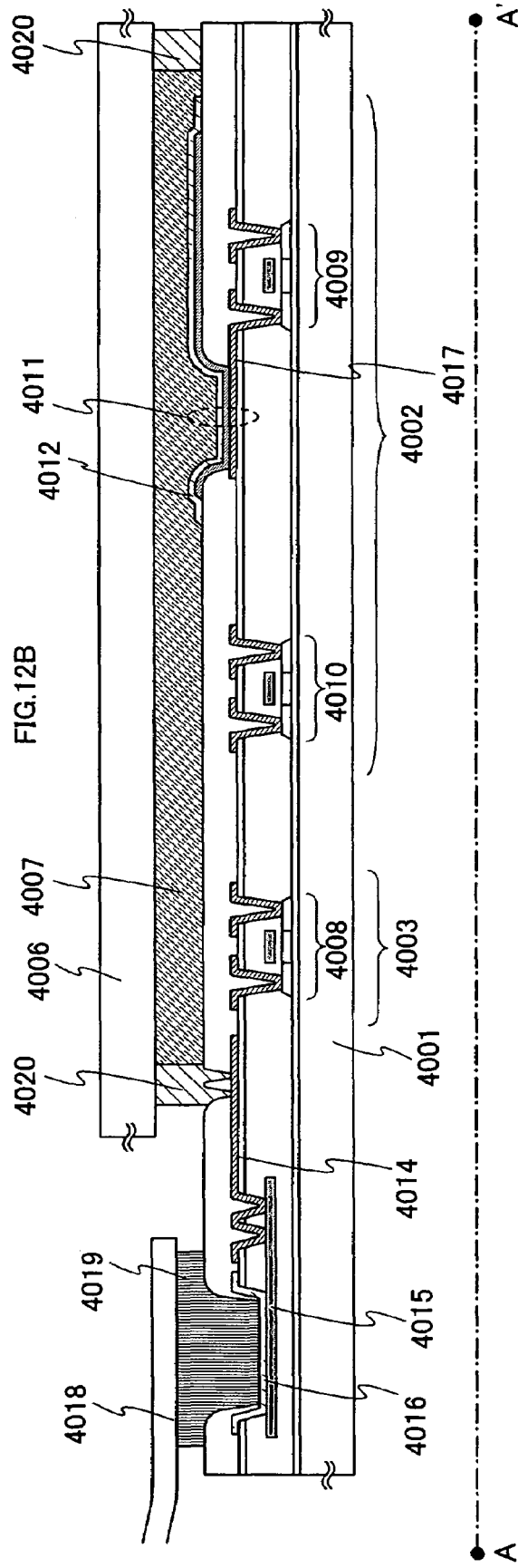
FIG.12A
FIG.12B

SEMICONDUCTOR DISPLAY DEVICE AND ELECTRONIC APPLIANCE

BACKGROUND OF THE INVENTION

1. Field of the Invention

The present invention relates to a semiconductor display device for displaying images by a time gray scale method. In addition, the invention relates to an electronic appliance using the semiconductor display device.

2. Description of the Related Art

As a driving method of a light-emitting device which is one of the semiconductor display devices, there is a time gray scale method for displaying gray scales by controlling the emission period of pixels using a binary voltage value of a digital video signal. Generally, electroluminscent materials exhibit high response in comparison with liquid crystals; therefore, the light-emitting device is more suitable for the time gray scale method. Specifically, in the case of displaying images by the time gray scale method, one frame period is divided into a plurality of sub-frame periods. In accordance with video signals, pixels are controlled to emit light or no light in each sub-frame period. According to such a structure, the total length of periods in which pixels emit light within one frame period can be controlled by the video signals, thereby gray scales can be displayed.

Display-Period-Separated (DPS) method is one of the time gray scale methods. The following Non-patent Document 1 discloses a specific driving method of the DPS method. [Non-patent Document 1]

Tatsuo Uchida, Heiju Uchiike, Yukio Shimura, Flat-panel Display Comprehensive Dictionary, first edition, Japan, published by Kogyo Chosakai Publishing Inc. in Dec. 25, 2001 (p. 456).

In the DPS method, each sub-frame period includes a period for writing video signals to pixels (writing period), and a period for controlling the luminance of light-emitting elements according to the video signals (display period). Gray scales of the pixels are determined by the total length of display periods, in which the light-emitting elements emit light, in the whole display periods within one frame period.

In the case of the DPS method, each sub-frame period is required to be longer than the writing period. Therefore, in the DPS method, when the number of sub-frame periods is increased in order to increase the number of gray scales, the writing period is required to be shortened by increasing the drive frequency of a driver circuit, or the frame frequency is required to be decreased. However, taking into account the reliability of the driver circuit, it is not preferable to increase the drive frequency much. Further, the time gray scale method including the DPS method has a problem in that more pseudo-contours tend to be displayed in the pixel portion if the frame frequency is lower.

The pseudo-contours are unnatural contour lines which are often perceived when a middle-level gray scale is displayed using the time gray scale method, which are supposedly caused by variations of perceived luminance as a peculiar characteristic of the human vision. It is known that when the sub-frame period is further divided into a plurality of periods, generation of pseudo-contours can be suppressed even when the display device is driven with the same frame frequency. In the case of dividing the sub-frame period, however, each divided sub-frame period is required to be longer than the writing period. Accordingly, the drive frequency of the driver circuit is undesirably increased as in the case where the number of gray scales is increased.

SUMMARY OF THE INVENTION

In view of the foregoing problems, the invention provides a semiconductor display device which can suppress the drive frequency while increasing the number of gray scales. In addition, the invention provides a semiconductor display device which can suppress the generation of pseudo-contours.

According to the invention, a period for inputting video signals to one row of pixels (row writing period) is divided in half. In the first half row writing period (first row writing period) and the second half row writing period (second row writing period), video signals are written to different rows.

In the invention, two scan line driver circuits are used for selecting rows which are inputted with video signals in the first row writing period and the second row writing period. Specifically, the selection of rows in the first row writing period is performed using the first scan line driver circuit. In addition, the selection of rows in the second row writing period is performed using the second scan line driver circuit. Thus, according to the invention, different rows can be selected in the first row writing period and the second row writing period. By using a signal line driver circuit, video signals can be written to the rows selected in the first row writing period, and then video signals can be written to the rows selected in the second row writing period.

Each of the two scan line driver circuits is provided with a selection circuit having a plurality of switches. With the two selection circuits, while an arbitrary row is selected by one of the scan line driver circuits, the output to the arbitrary row from the other scan line driver circuit can set at high impedance so that the arbitrary row is not electrically connected to the other scan line driver circuit.

According to such a configuration of the invention, it is possible that before the termination of a writing period for writing a video signal of one bit to the pixels of the whole rows (writing period), a video signal of the next bit can be written to the row to which the video signal of one bit has already been written. Accordingly, writing periods included in two adjacent sub-frame periods can appear in an over-lapped manner.

A semiconductor device of the invention comprises a pixel portion, a signal line driver circuit, a first scan line driver circuit, and a second scan line driver circuit, wherein the pixel portion includes a plurality of pixels, the plurality of pixels can be selected per row by the first scan line driver circuit, the plurality of pixels can be selected per row by the second scan line driver circuit, writing of a first video signal to the pixels in the row selected by the first scan line driver circuit among the plurality of pixels is controlled by the signal line driver circuit, writing of a second video signal to the pixels in the row selected by the second scan line driver circuit among the plurality of pixels is controlled by the signal line driver circuit, each of the first and second scan line driver circuits includes a selection circuit, an output from the second scan line driver circuit to the plurality of pixels is set at high impedance by the selection circuit while the row is selected by the first scan line driver circuit, and an output from the first scan line driver circuit to the plurality of pixels is set at high impedance while the row is selected by the second scan line driver circuit.

The semiconductor display device of the invention includes a light-emitting device having pixels each of which includes a light-emitting element typified by an organic light-emitting element (OLED), a liquid crystal display device, a DMD (Digital Micromirror Device), a PDP (Plasma Display Panel), an FED (Field Emission Display), and other display devices capable of displaying images with a time gray scale method.

In this specification, a light-emitting element means an element the luminance of which is controlled with current or voltage. Specifically, the light-emitting element includes an OLED (Organic Light Emitting Diode), an MIM type electron source element (electron-emitting element) used in an FED (Field Emission Display), and the like.

An OLED (Organic Light-Emitting Diode) as one of the light-emitting elements includes a layer containing an electroluminescent material which can exhibit luminescence (Electroluminescence) with an electric field applied thereto, an anode, and a cathode. The electroluminescent layer is provided between the anode and the cathode, and has a single layer or a plurality of layers. These layers may include an inorganic compound. The luminescence in the electroluminescent layer includes luminescence which is generated when an excited singlet state returns to a ground state (fluorescence) and luminescence which is generated when an excited triplet state returns to a ground state (phosphorescence).

In addition, the light-emitting device includes a panel in the condition that light-emitting elements are sealed, and a module in the condition that an IC or the like including a controller is mounted on the panel.

A transistor used in the light-emitting device of the invention may be a thin film transistor using a polycrystalline semiconductor, a micro-crystalline semiconductor (including a semi-amorphous semiconductor), or an amorphous semiconductor; however, the invention is not limited to the thin film transistor. For example, a transistor using single-crystalline silicon, or a transistor using SOI may be employed. In addition, a transistor using an organic semiconductor may be used as well as a carbon nanotube transistor. Further, a transistor provided in each pixel of the light-emitting device of the invention may have a single-gate structure, a double-gate structure, or a multi-gate structure having more than two gates.

According to the aforementioned structure of the invention, before a video signal of one bit is inputted to the pixels in the whole rows, a video signal of the next bit can be written to the row to which the video signal of one bit has already been written. Accordingly, before the termination of a writing period, the next sub-frame period can be started, thereby the length of the sub-frame period can be made shorter than the writing period.

Thus, the length of the writing period can be secured even when the number of sub-frame periods appearing in one frame period is increased, thereby the drive frequency of a driver circuit can be suppressed while increasing the number of gray scales. Further, even when the sub-frame period is further divided into a plurality of periods, the length of the writing period can be secured, thereby the drive frequency of a driver circuit can be suppressed while suppressing the generation of pseudo-contours.

Note that the time gray scale method includes a Simultaneously-Erasing-Scan (SES) method in addition to the DPS method. According to the SES method, a sub-frame period is made shorter than a writing period by forming a transistor for forcibly stopping a current supply to a light-emitting element in each pixel, and providing a period in which the pixels do not emit light (non-display period). In the case of the light-emitting device of the invention, the non-display period can be made shorter as compared to the SES method, or eliminated ultimately. Therefore, the duty ratio (ratio of the periods used for controlling gray scales which occupy one frame period) can be increased. Accordingly, the power consumption of the pixel portion can be suppressed while enhancing the contrast of a displayed image. Further, according to the invention, the number of transistors provided in each pixel can be suppressed as compared to the SES method. Accordingly, in the case of a bottom-emission light-emitting device in which light emitted from light-emitting elements travels in the direction of the transistors, the aperture ratio of pixels (ratio of the areas through which light can be extracted) can be increased.

In addition, as one of the time gray scale methods, there is a driving method in which a row writing period is divided in half, the first half of the row writing period (first row writing period) is used for writing video signals to pixels, and the second half of the row writing period (second row writing period) is used for supplying signals to each pixel for forcibly stopping a current supply to a light-emitting element. By writing such signals for forcibly stopping a current supply to a light-emitting element in each pixel, a non-display period can be provided, thus the sub-frame period can be made shorter than the writing period. According to the invention, there is no need to generate signals for forcibly stopping a current supply to light-emitting elements in the driver circuit unlike the aforementioned driving method; therefore, the configuration of the driver circuit can be further simplified. In addition, in the case of the light-emitting device of the invention, the non-display period can be made shorter as compared to the aforementioned method, or eliminated ultimately. Therefore, the duty ratio (ratio of the periods used for controlling gray scales which occupy one frame period) can be increased. Accordingly, the power consumption of the pixel portion can be suppressed while enhancing the contrast of a displayed image. Further, according to the invention, the number of the signal writings to pixels can be smaller than that in the aforementioned driving method; therefore, the power consumption of the signal line driver circuit can be suppressed.

Note that provided that the average luminance of a light-emitting element in one frame period is the same, the instantaneous luminance of the light-emitting element can be lower as the duty ratio becomes the lower. Accordingly, the higher the duty ratio is, the lower the voltage applied between a pair of electrodes of the light-emitting element can be. Therefore, voltage drop due to the wiring resistance can be suppressed, which in turn can suppress variations in luminance of light-emitting elements due to the voltage drop. In addition, since the voltage drop due to the wiring resistance can be suppressed, the width of the wiring for supplying current to the light-emitting elements can be decreased, which leads to a higher aperture ratio.

BRIEF DESCRIPTION OF THE DRAWINGS

FIG. 12A is a top view of a light-emitting device of the invention, and FIG. 12B is a sectional view thereof.

DETAILED DESCRIPTION OF THE PREFERRED EMBODIMENTS

Although the invention will be fully described by way of embodiment mode and embodiments with reference to the accompanying drawings, it is to be understood that various changes and modifications will be apparent to those skilled in the art. Therefore, unless such changes and modifications depart from the scope of the invention, they should be construed as being included therein.

Figure 1A:
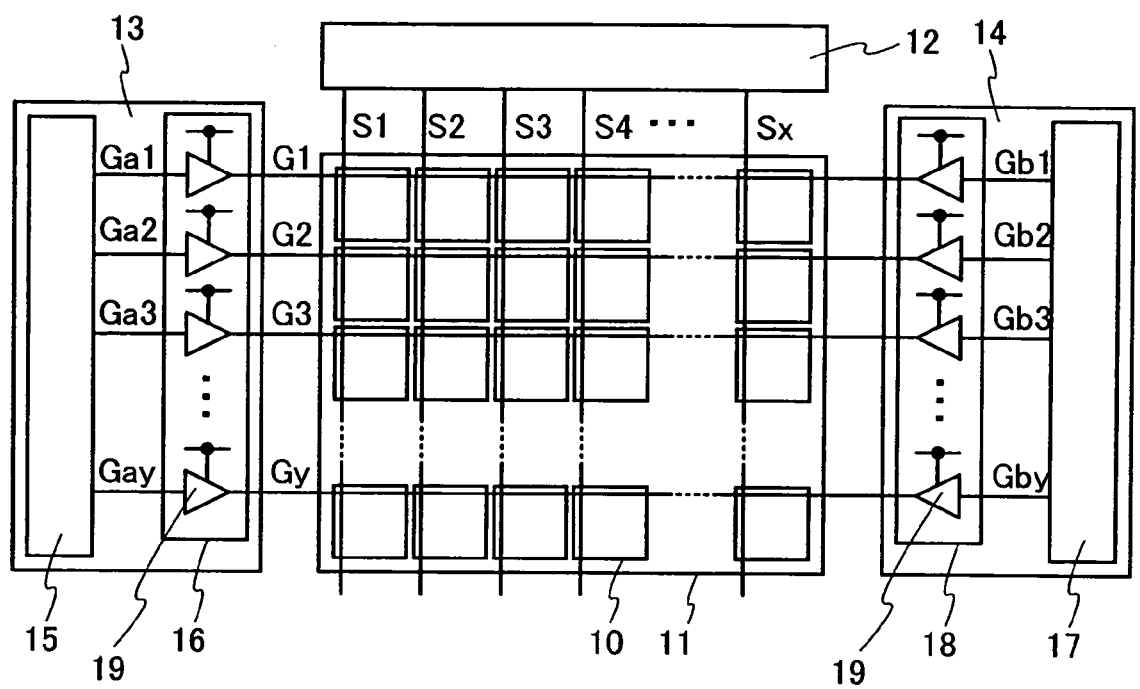
FIGS. 1A and 1B illustrate configurations of a semiconductor display device of the invention.

FIG. 1A illustrates a configuration of a semiconductor display device of the invention. The semiconductor display device shown in FIG. 1A includes a pixel portion 11 where a plurality of pixels 10 are formed, a signal line driver circuit 12, a first scan line driver circuit 13, and a second scan line driver circuit 14. By the first scan line driver circuit 13 and the second scan line driver circuit 14, the pixels 10 in each row which share scan lines G1 to Gy can be selected. The signal line driver circuit 12 can control an input of video signals to the pixels 10 in the row selected by the first scan line driver circuit 13 or the second scan line driver circuit 14 through signal lines S1 to Sx.

In addition, the first scan line driver circuit 13 includes a first selection signal generating circuit 15 for generating signals (selection signals) for sequentially selecting the scan lines G1 to Gy, and a first selection circuit 16 for controlling an input of the generated selection signals to the scan lines G1 to Gy. Similarly, the second scan line driver circuit 14 includes a second selection signal generating circuit 17 for generating signals (selection signals) for sequentially selecting the scan lines G1 to Gy, and a second selection circuit 18 for controlling an input of the generated selection signals to the scan lines G1 to Gy.

Figure 1B:
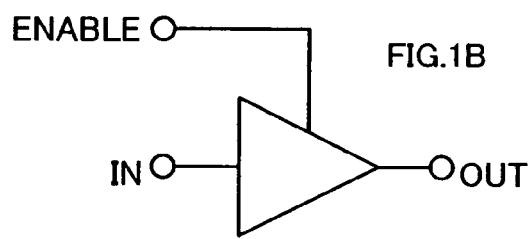

Each of the first selection circuit 16 and the second selection circuit 18 includes a plurality of tri-state gates 19 corresponding to the scan lines G1 to Gy respectively. FIG. 1B illustrates a logic symbol of the tri-state gate 19. The tri-state gate 19 is a logic circuit capable of setting the output at three states of H level (H), L level (L), and high impedance (Z) using a control signal (ENABLE).

Table 1 is a truth table illustrating the relationship between a control signal, a signal (IN) supplied to an input terminal, and a signal (OUT) outputted from the output terminal.

TABLE 1

| ENABLE | IN | OUT |
|--------|----|----|
| L | — | Z |
| H | L | L |
| H | H | H |

Note that the truth table shown in Table 1 shows the IN signal and the OUT signal at the same level; however, the IN signal and the OUT signal may be at opposite levels as shown in the truth table in Table 2.

TABLE 2

| ENABLE | IN | OUT |
|--------|----|----|
| L | — | Z |
| H | L | H |
| H | H | L |

In addition, in the truth tables shown in Table 1 and Table 2, the OUT signal is at high impedance when the control signal is at L level; however, the OUT signal may be at high impedance when the control signal is at H level. Table 3 is a truth table in the case where the level of the control signal is opposite to the one shown in the truth table in Table 1. In addition, Table 4 is a truth table in the case where the level of the control signal is opposite to the one shown in the truth table in Table 2.

TABLE 3

| ENABLE | IN | OUT |
|--------|----|----|
| H | — | Z |
| L | L | L |
| L | H | H |

TABLE 4

| ENABLE | IN | OUT |
|--------|----|----|
| H | — | Z |
| L | L | H |
| L | H | L |

Note that the tri-state gate 19 may be a logic circuit which operates in accordance with the truth tables shown in Tables 1 to 4. For example, a transmission gate, a tri-state buffer, and the like may be employed.

Figure 2:
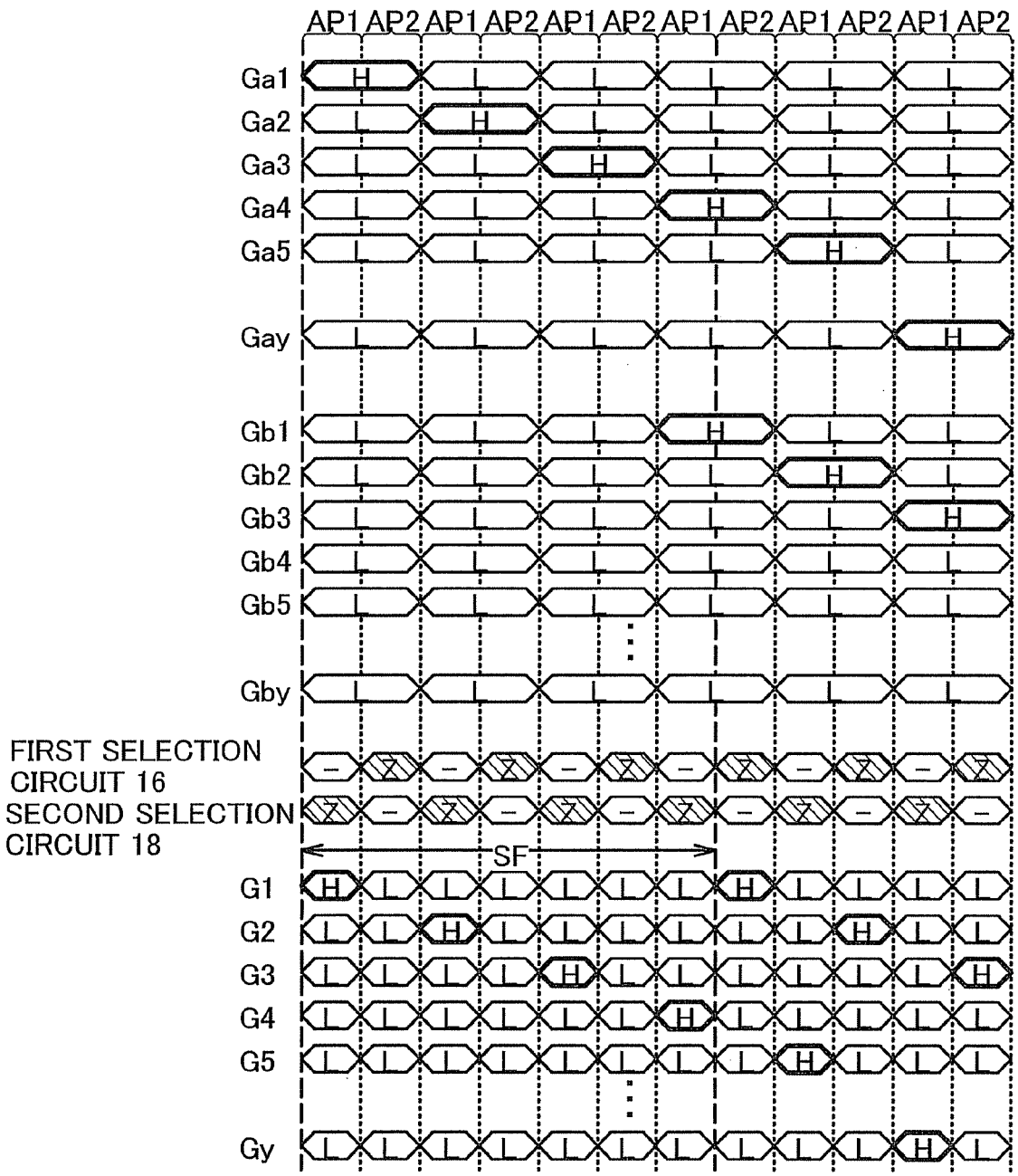
FIG. 2 illustrates the levels of selection signals inputted to scan lines G1 to Gy, the levels of selection signals Ga1 to Gay, and the levels of selection signals Gb1 to Gby.

The tri-state gate 19 included in the first selection circuit 16 and the tri-state gate 19 included in the second selection circuit 18 operate in such a manner that one of them is at high impedance while the other is outputting an H-level or L-level signal. FIG. 2 illustrates the levels of selection signals inputted to the scan lines G1 to Gy in the case where the tri-state gate 19 operates in accordance with the truth table shown in Table 1 or 3. Note that in FIG. 2, selection signals inputted to the respective tri-state gates 19 included in the first selection circuit 16 are indicated by Ga1 to Gay while selection signals inputted to the respective tri-state gates 19 included in the second selection circuit 18 are indicated by Gb1 to Gby. In addition, a period in which the output of the tri-state gate 19 of the first selection circuit 16 or the tri-state gate 19 of the second selection circuit 18 is at high impedance is indicated by (Z), and a period other than this (period in which the output is at low impedance) is indicated by (−).

As shown in FIG. 2, in a first row writing period AP1, the output of each tri-state gate 19 included in the first selection circuit 16 is at low impedance, and the output of each tri-state gate 19 included in the second selection circuit 18 is at high impedance. Meanwhile, in a second row writing period AP2, the output of each tri-state gate 19 included in the first selection circuit 16 is at high impedance while the output of each tri-state gate 19 included in the second selection circuit 18 is at low impedance. Accordingly, in the first row writing period AP1, selection signals at H level or L level are inputted to the scan lines G1 to Gy from the first scan line driver circuit 13, and in the second row writing period AP2, selection signals at H level or L level are inputted to the scan lines G1 to Gy from the second scan line driver circuit 14.

In the first row writing period AP1 and the second row writing period AP2 in FIG. 2, a scan line to which a selection signal at H level is inputted among the scan lines G1 to Gy corresponds to the selected scan line. Note that FIG. 2 illustrates the case where the scan line is selected when the selection signal is at H level; however, the scan line may be selected when the selection signal is at L level. To the pixels which share the selected scan line, corresponding video signals are inputted from the signal line driver circuit 12.

Note that in the invention, scan lines which have already been selected in the first row writing period AP1 may be selected again in the second row writing period AP2 before the whole scan lines G1 to Gy are selected in the first row writing period AP1. In addition, video signals having different bits can be inputted in the first row writing period AP1 and the second row writing period AP2. Accordingly, as for the scan line G1, for example, the scan line G1, which has already been selected in the first row writing period AP1, is selected again in the second row writing period AP2 before the scan line Gy is selected in the first row writing period AP1. In addition, video signals, which are written to the pixels when the scan line G1 is selected in the first row writing period AP1, are held until the scan line G1 is selected in the second row writing period AP2. Thus, the period after the scan line G1 is selected in the first row writing period AP1 until the scan line G1 is selected again in the second row writing period AP2 corresponds to a sub-frame period SF.

Note that FIG. 2 illustrates the example where the scan line G1, which has already been selected in the first row writing period AP1, is selected again in the second row writing period AP2 before the scan line Gy is selected in the first row writing period AP1; however, the invention is not limited to such a configuration. The scan line G1, which has already been selected in the first row writing period AP1, may be selected again in the second row writing period AP2 after the scan line Gy is selected in the first row writing period AP1. In this case also, the period after the scan line G1 is selected in the first row writing period AP1 until the scan line G1 is selected again in the second row writing period AP2 corresponds to the sub-frame period SF. Alternatively, the scan line G1, which has already been selected in the first row writing period AP1, may be selected again in first row writing period AP1 after the scan line Gy is selected in the first row writing period AP1. In this case, the period after the scan line G1 is selected in the first row writing period AP1 until the scan line G1 is selected again in the first row writing period AP1 corresponds to the sub-frame period SF.

Description is made below, taking as an example a light-emitting device which is one of the semiconductor display devices of the invention, on the specific configuration and the driving method thereof.

Figure 3:
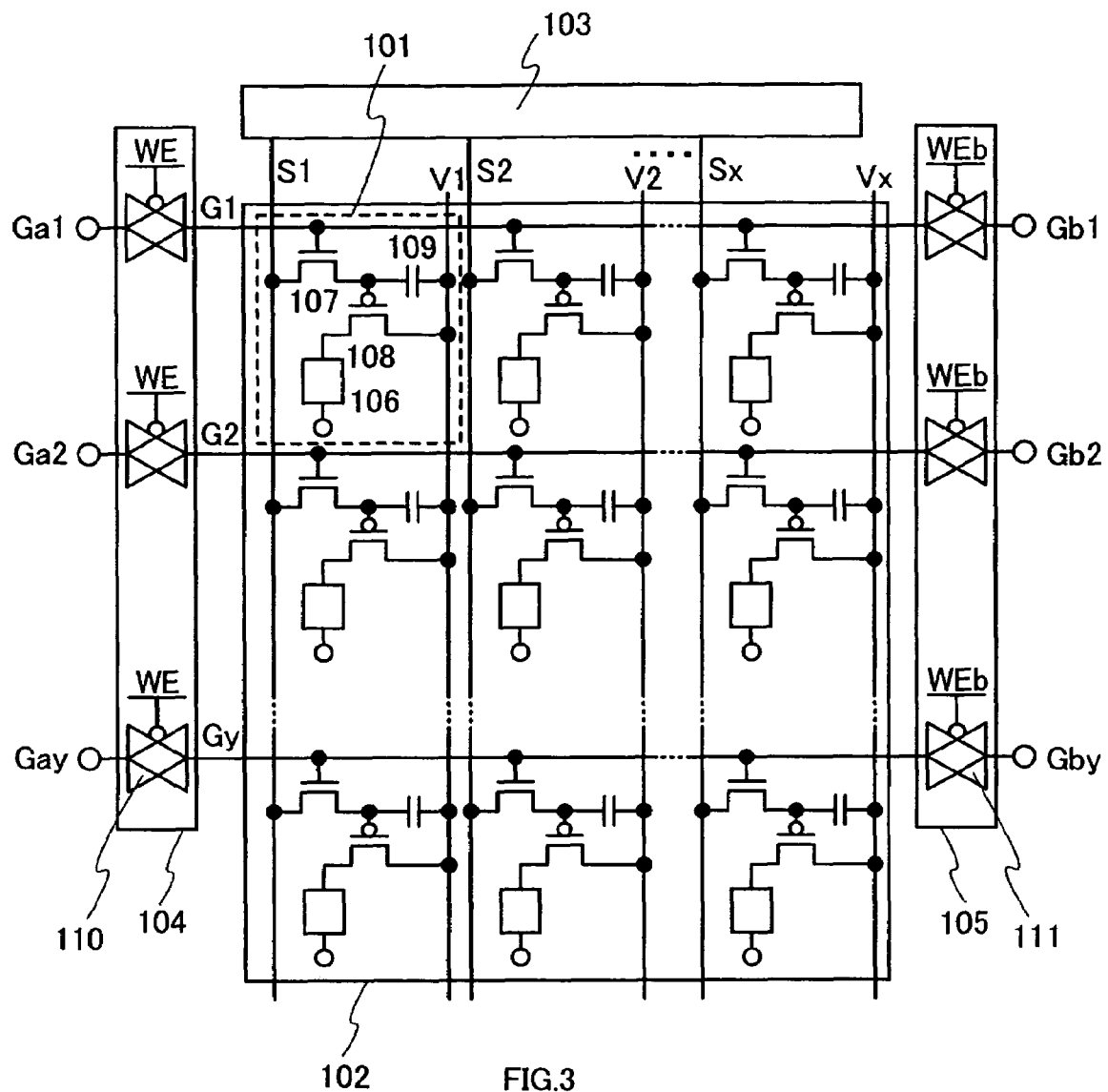
FIG. 3 illustrates a configuration of a light-emitting device of the invention.

FIG. 3 illustrates a configuration of a light-emitting device of the invention. The light-emitting device in FIG. 3 includes a pixel portion 102 where a plurality of pixels 101 are formed, a signal line driver circuit 103, a first selection circuit 104 included in a first scan line driver circuit, and a second selection circuit 105 included in a second scan line driver circuit. In the pixel portion 102, signal lines S1 to Sx, scan lines G1 to Gy, and power supply lines V1 to Vx are formed. Note that the number of the signal lines S1 to Sx is not necessarily identical to the number of the power supply lines V1 to Vx.

In addition, each pixel 101 includes a light-emitting element 106, a switching transistor 107 for controlling an input of video signals to the pixel 101, a driving transistor 108 for controlling a current supply to the light-emitting element 106 in accordance with the video signal, and a storage capacitor 109 for holding the gate-source voltage (gate voltage) of the driving transistor 108. Note that the storage capacitor 109 is not necessarily provided in the case where the gate capacitance of the driving transistor 108 is large enough.

Specifically, the gate of the switching transistor 107 is connected to the scan line Gj (j=1 to y). One of the source and drain of the switching transistor 107 is connected to the signal line Si (i=1 to x) while the other is connected to the gate of the driving transistor 108. One of the source and drain of the driving transistor 108 is connected to the power supply line Vi (i=1 to x) while the other is connected to a first electrode of the light-emitting element 106. Note that a connection in this specification means an electrical connection.

The light-emitting element 106 includes a first electrode, a second electrode, and an electroluminescant layer formed between them. The first electrode of the light-emitting element 106 corresponds to an anode while a second electrode thereof corresponds to a cathode.

Note that FIG. 3 illustrates the case where the switching transistor 107 is an N-channel transistor; however, the switching transistor 107 may be a P-channel transistor. In addition, FIG. 3 illustrates the case where the driving transistor 108 is a P-channel transistor; however, the driving transistor 108 may be an N-channel transistor. Note that in the case where the first electrode of the light-emitting element 106 is an anode, the driving transistor 108 is desirably a P-channel transistor. Meanwhile, in the case where the first electrode of the light-emitting element 106 is a cathode, the driving transistor 108 is desirably an N-channel transistor.

The first selection circuit 104 and the second selection circuit 105 have a plurality of transmission gates 110 and a plurality of transmission gates 111 respectively, each of which functions as a tri-state gate. The transmission gates 110 are inputted with control signals WE while the transmission gates 111 are inputted with controlled signals WEb which are obtained by inverting the control signals WE.

Figure 4:
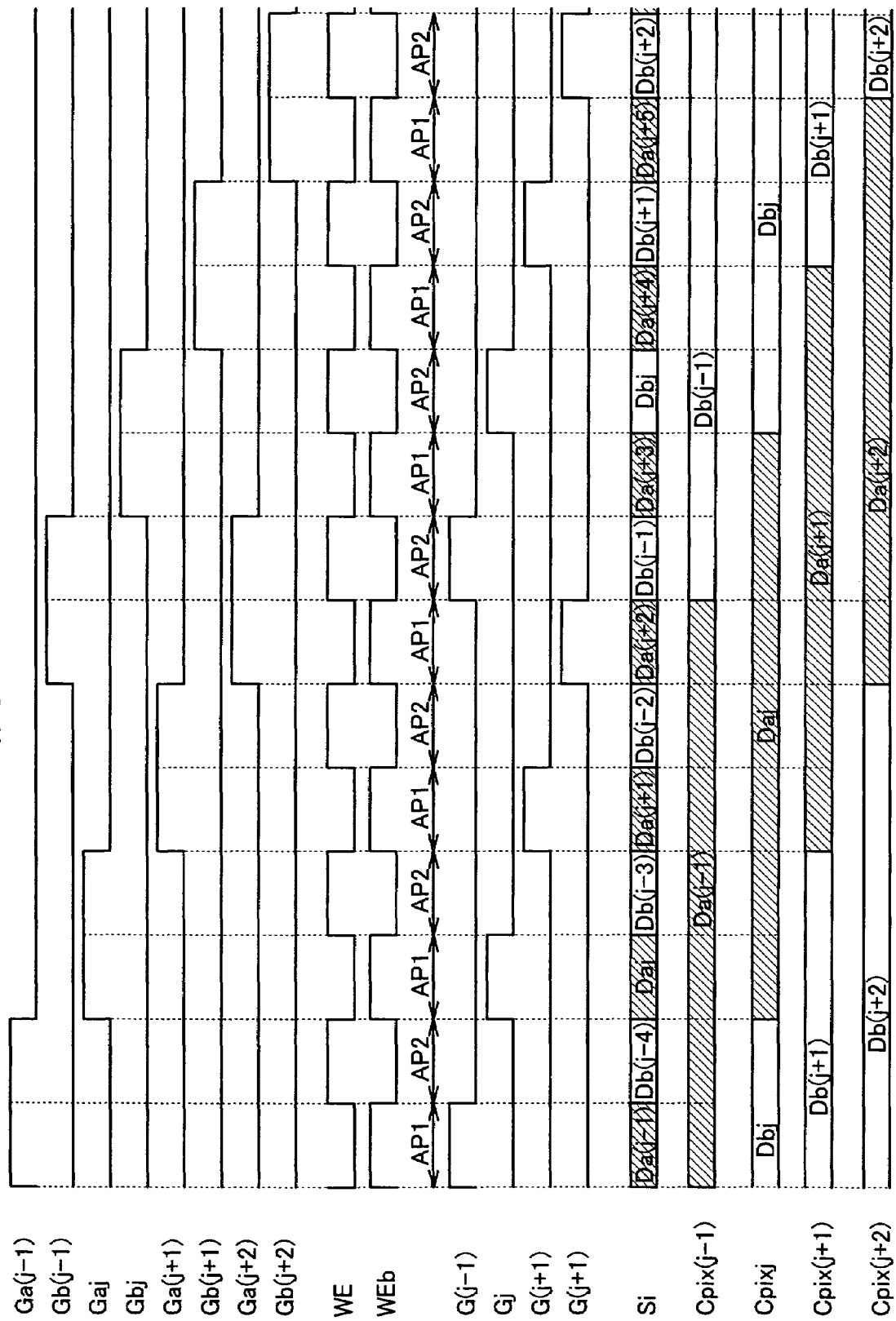
FIG. 4 is a timing chart of the light-emitting device shown in FIG. 3.

FIG. 4 is a timing chart of the light-emitting device shown in FIG. 3. Note that in FIG. 4, it is assumed that (j−1), j, (j+1), and (j+2) are all included in 1 to y. In addition, Da(j−1), Daj, Da(j+1), and Da(j+2) correspond to the data of video signals corresponding to the pixels 101 in the respective rows, all of which have the same bit. In addition, Db(j−1), Dbj, Db(j+1), and Db(j+2) correspond to the data of video signals corresponding to the pixels 101 in the respective rows, all of which have the same bit. Cpix(j−1), Cpixj, Cpix(j+1), and Cpix(j+2) indicate the data of video signals held in the storage capacitors 109 included in the pixels 101 in the respective rows.

The control signals WE and WEb are synchronous with the first row writing period AP1 and the second row writing period AP2. When the scan lines G(j−1), Gj, G(j+1), and G(j+2) are selected in the first row writing period AP1 or the second row writing period AP2, data of video signals inputted to the signal line Si in the period is written to the pixels 101 in the respective rows, and held in capacitors such as the storage capacitors 109. The driving transistor 108 supplies current to the light-emitting element 106 in accordance with the video signal, thereby the light-emitting element 106 emits light at the luminance corresponding to the current.

Note that the timing at which video signals are written to the pixels 101 differs in each row by the total length of the row writing periods which include the first row writing period AP1 and the second row writing period AP2. Accordingly, the timing at which each sub-frame period starts differs between the pixels 101 of each row.

Figure 5A:
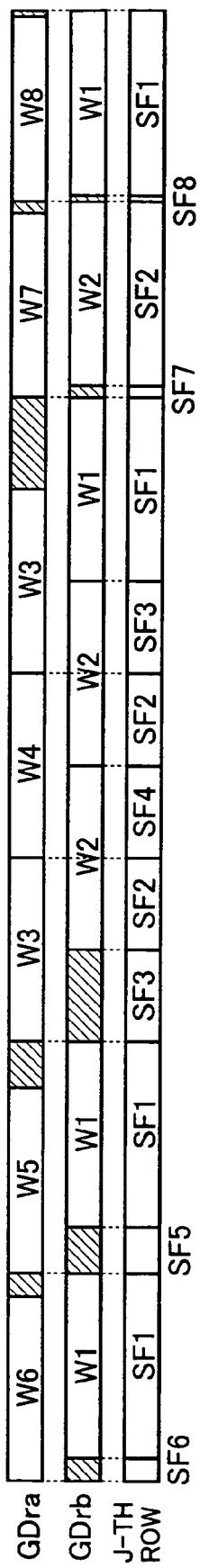
FIGS. 5A and 5B are timing charts of writing periods.

Description is made below on the timing of each sub-frame period in the light-emitting device of the invention. FIG. 5A shows the timing of writing periods indicated by GDra at which video signals are written by the first scan line driver circuit, and the timing of writing periods indicated by GDrb at which video signals are written by the second scan line driver circuit. In addition, the timing of each sub-frame period which appears in the pixels in the j-th row is shown. Note that FIG. 5A illustrates an example where 8-bit video signals are inputted to a QVGA panel (320×240 pixels).

W1 to W8 each indicates the writing period corresponding to a video signal having each bit. Each of the writing periods W1 to W8 has a length obtained by multiplying the half-cycle of a clock signal supplied to the first scan line driver circuit or the second scan line driver circuit by 320.

In FIG. 5A, the period after the writing period W6 is started by the first scan line driver circuit until the writing period W1 is started by the second scan line driver circuit corresponds to a sub-frame period SF6. In addition, the period after the writing period W1 is started by the second scan line driver circuit until the writing period W5 is started by the first scan line driver circuit corresponds to a sub-frame period SF1. Similarly, each timing of the other sub-frame periods is controlled by the first scan line driver circuit and the second scan line driver circuit.

Figure 5B:
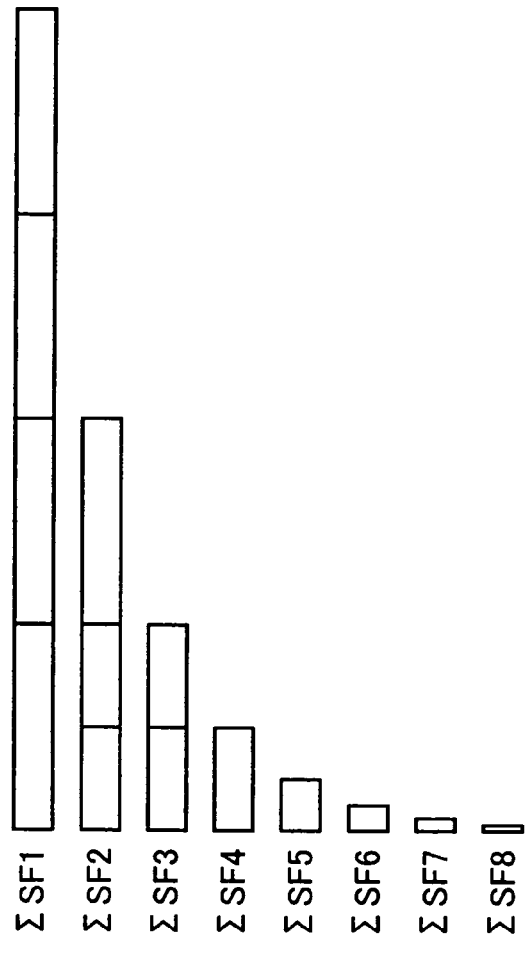

FIG. 5B illustrates a total length of each sub-frame period. As shown in FIG. 5B, SSF1:SSF2:SSF3:SSF4:SSF5:SSF6: SSF7:SSF8=$2^7:2^6:2^5:2^4:2^3:2^2:2^1:2^0$. In this manner, by controlling the total length of the sub-frame period SFn corresponding to the n-th bit to be $2^{n-1}$ times as long as the shortest sub-frame period SF1, $2^8$ gray scale levels can be displayed.

Figure 6:
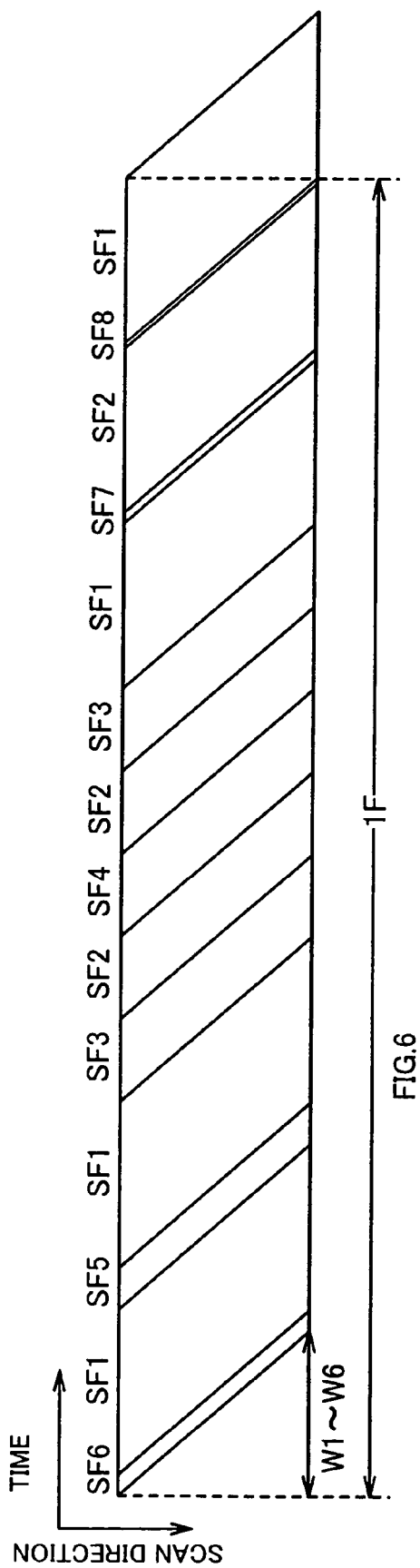
FIG. 6 is a timing chart of sub-frame periods SF1 to SF8 in the whole pixel portions.

FIG. 6 is a timing chart of the sub-frame periods SF1 to SF8 in the whole pixel portion in the case where the driving method shown in FIG. 5A is adopted. In FIG. 6, abscissa indicates time while ordinate indicates the direction in which scan lines are selected (scan direction). In each sub-frame period SF1 to SF8, the period after the first row is selected until the last row is selected corresponds to the writing periods W1 to W6 of each bit. In each row, the period until the termination of the whole sub-frame periods SF1 to SF8 corresponds to one frame period F.

Note that in the driving methods shown in FIGS. 5A and 6, the whole sub-frame periods appear continuously, resulting in the duty ratio of 100%. However, the invention is not limited to such driving method, and a non-display period may be provided between the sub-frame periods. In order to provide a non-display period, a signal for forcibly stopping a current supply to a light-emitting element may be written to each pixel.

Embodiment 1

Figure 7:
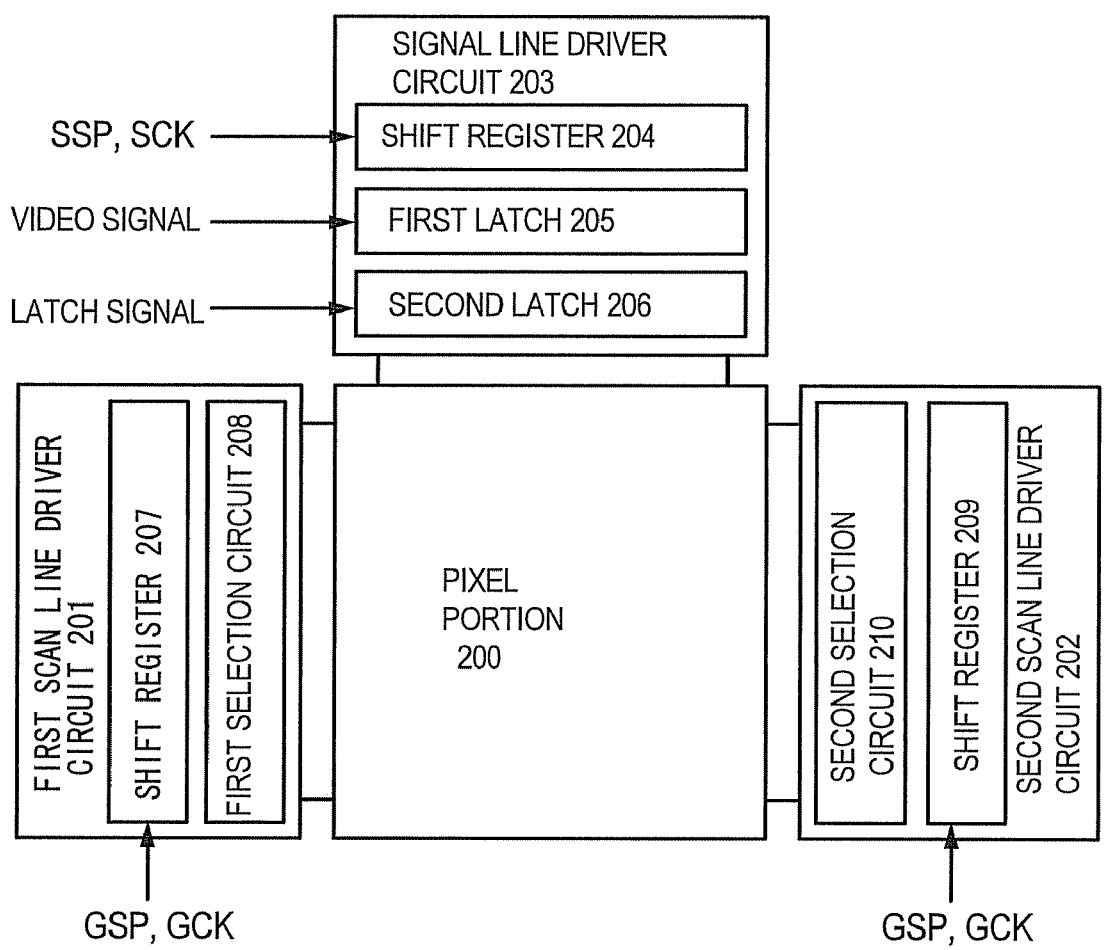
FIG. 7 is a block diagram of a semiconductor display device of the invention.

In this embodiment, description is made on a configuration of a driver circuit used in the semiconductor display device of the invention. FIG. 7 is a block diagram of the semiconductor display device of the invention. The semiconductor display device shown in FIG. 7 includes a pixel portion 200 where a plurality of pixels each having a display element such as a light-emitting element and a liquid crystal element are formed, first and second scan line driver circuits 201 and 202 for selecting each pixel, and a signal line driver circuit 203 for controlling an input of video signals to the selected pixel.

In FIG. 7, the signal line driver circuit 203 includes a shift register 204, a first latch 205, and a second latch 206. The shift register 204 is inputted with clock signals SCK for signal lines, and start pulse signals SSP for the signal lines. Upon input of the clock signals SCK and the start pulse signals SSP, the shift register 204 generates timing signals. The generated timing signals are sequentially inputted to the first latch 205 of the first stage. Upon input of the timing signals to the first latch 205, video signals are sequentially written to and held in the first latch 205 in synchronization with pulses of the timing signals. Note that video signals are sequentially written to the first latch 205 in this embodiment; however, the invention is not limited to such a configuration. For example, the first latch 205 having a plurality of stages may be divided into several groups, and video signals may be inputted to each group in parallel, namely a division drive may be performed. Note that the number of groups for this case is called the division number. For example, when the latch is divided into groups each having four stages, division drive is performed with the division number of four.

Upon termination of writing video signals to the whole stages of the first latch 205, latch signals (Latch Pulses) are inputted to the second latch 206 of the second stage, and the video signals held in the first latch 205 are written to the second latch 206 all at once in synchronization with the latch signals, and held therein. The first latch 205, which has already transmitted video signals to the second latch 206, is sequentially written with the next video signals in synchronization with timing signals from the shift register 204. In parallel with the second writing to the first latch 205, the video signals written and held in the second latch 206 are inputted to the pixel portion 200.

Note that an alternative circuit capable of selecting signal lines such as a decoder may be employed instead of the shift register 204.

Next, description is made on the configuration of the first scan line driver circuit 201. The first scan line driver circuit 201 includes a shift register 207 corresponding to a first selection signal generating circuit, and a first selection circuit 208. In addition, a level shifter or a buffer may be provided if necessary. In the first scan line driver circuit 201, upon input of clock signals GCK for the scan line driver circuit and start pulse signals GSP for the scan line driver circuit to the shift register 207, selection signals are generated. The generated selection signals are inputted to the first selection circuit 208. The first selection circuit 208 controls an input of the selection signals to a corresponding scan line in accordance with control signals. Each scan line is connected to the gates of switching transistors in one row of pixels. Since the switching transistors in one row of pixels are required to be turned ON all at once, the first selection circuit 208 is capable of supplying a large amount of current.

Note that as the first selection signal generating circuit, an alternative circuit capable of selecting signal lines such as a decoder may be used instead of the shift register 207.

In addition, the second scan line driver circuit 202 includes, similarly to the first scan line driver circuit 201, a shift register 209 corresponding to a second selection signal line generating circuit, and a second selection circuit 210. In addition, a level shifter or a buffer may be provided if necessary. For the operation of the second scan line driver circuit 202, the operation of the first scan line driver circuit 201 can be referred to; therefore, the detailed description thereof is omitted in this embodiment.

Note that each of the first scan line driver circuit 201, the second scan line driver circuit 202, and the signal line driver circuit 203 may be formed either on the same substrate as the pixel portion 200 or a different substrate.

Note that this embodiment can be implemented in combination with the aforementioned embodiment mode or embodiments.

Embodiment 2

Figure 8A:
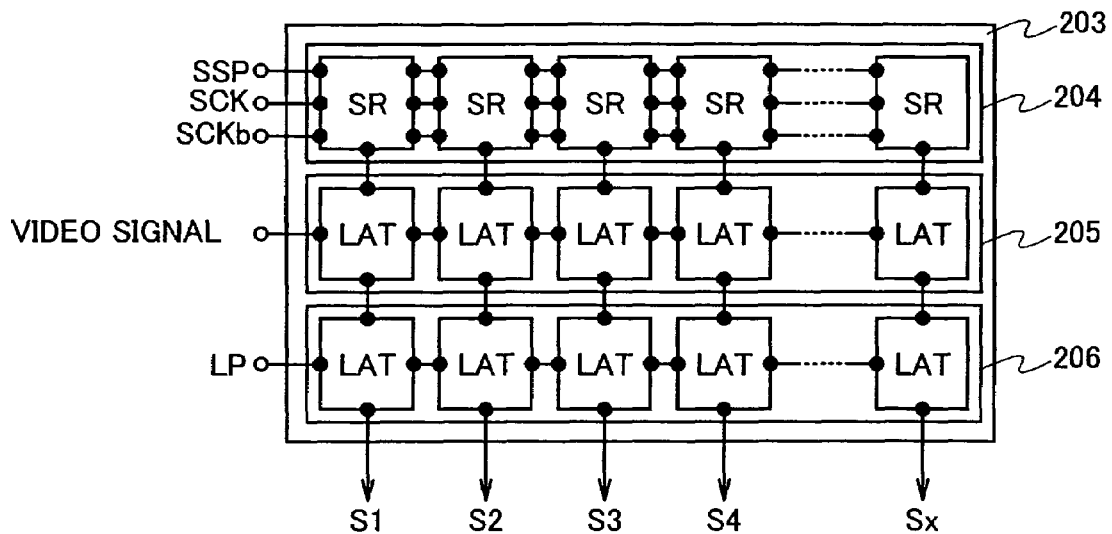
FIG. 8A is a block diagram of a signal line driver circuit.

In this embodiment, description is made in further detail on the operation of the signal line driver circuit 203 shown in FIG. 7. FIG. 8A is a block diagram of the signal line driver circuit 203. As described in Embodiment 1, the signal line driver circuit 203 includes the shift register 204, the first latch 205, and the second latch 206. The shift register 204 is inputted with clock signals SCK, start pulse signals SSP, and inverted clock signals SCKb. The first latch 205 is inputted with video signals, and the second latch 206 is inputted with latch signals LP. Video signals inputted to the first latch 205 in a serial manner are inputted to the signal lines S1 to Sx in a parallel manner from the second latch 206.

Figure 8B:
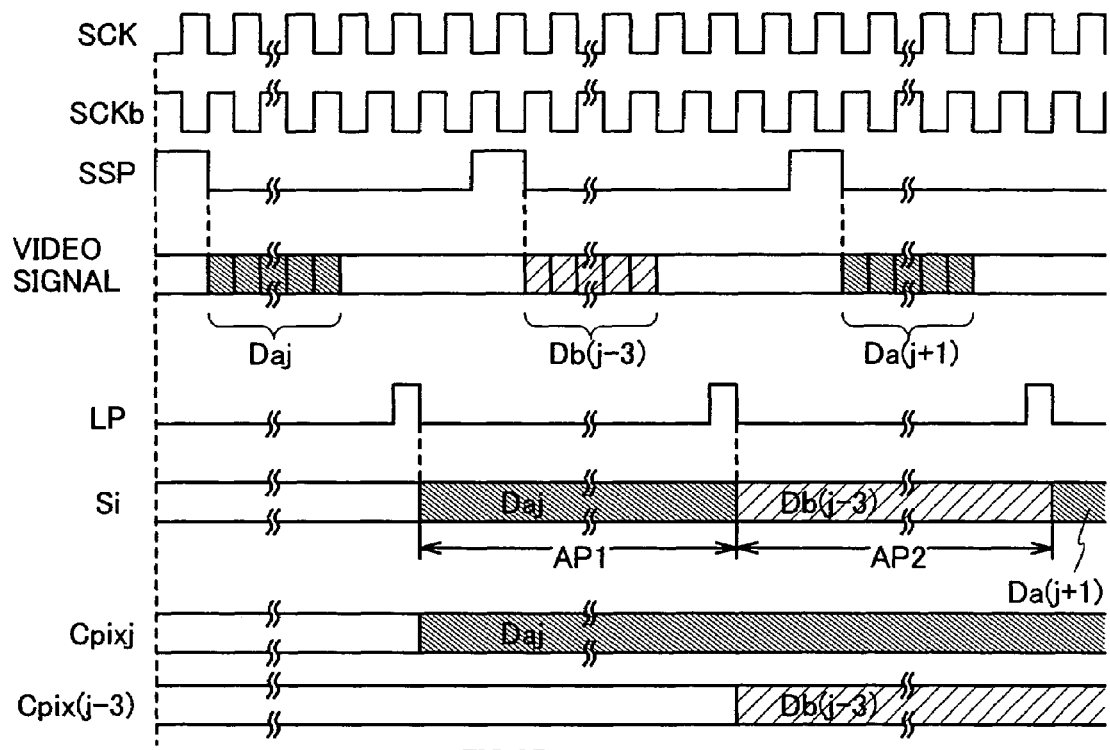
FIG. 8B is a timing chart thereof.

FIG. 8B is a timing chart of the signal line driver circuit 203 shown in FIG. 8A. In synchronization with a start pulse signal SSP, a serial video signal having the data of Daj which corresponds to the pixels in the j-th row is written to the first latch 205.

Then, the video signal having the data of Daj is written to the second latch 206 in synchronization with a latch signal LP, and then inputted to the signal line Si. In synchronization with the latch signal LP, the first row selection period AP1 starts, thereby the pixels in the j-th row are selected. Accordingly, the video signal having the data of Daj is written to and held in the storage capacitor Cpixj included in each pixel in the j-th row.

On the other hand, a serial video signal having the data of Db(j−3) which corresponds to the pixels in the (j−3)-th row is written to the first latch 205 in synchronization with the start pulse signal SSP.

Then, the video signal having the data of Db(j−3) is written to the second latch 206 in synchronization with the latch signal LP, and then inputted to the signal line Si. In synchronization with the latch signal LP, the second row selection period AP2 starts, thereby the pixels in the (j−3)-th row are selected. Accordingly, the video signal having the data of Db(j−3) is written and held in the storage capacitor Cpix(j−3) included in each pixel in the (j−3)-th row.

Meanwhile, in parallel with the second row selection period AP2, a serial video signal having the data of Da(j+1) which corresponds to pixels in the (j+1)-th row is written to the first latch 205 in synchronization with the start pulse signal SSP.

By repeating such operation, video signals can be written to the pixels in each row.

Note that the video signal having the data of Daj and the video signal having the data of Da(j+1) have the same bit although they are written to different rows. In addition, the video signal having the data of Db(j−3) has a different bit from the video signal having the data of Daj and the video signal having the data of Da(j+1).

This embodiment illustrates the example where the data of Db(j−3) is written to the first latch 205 after the data Daj; however, the invention is not limited to such a configuration. The data written after the data Daj does not have to correspond to the (j−3)-th row.

Note that this embodiment can be implemented in combination with the configurations shown in the aforementioned embodiment mode or embodiments.

Embodiment 3

Figure 9A:
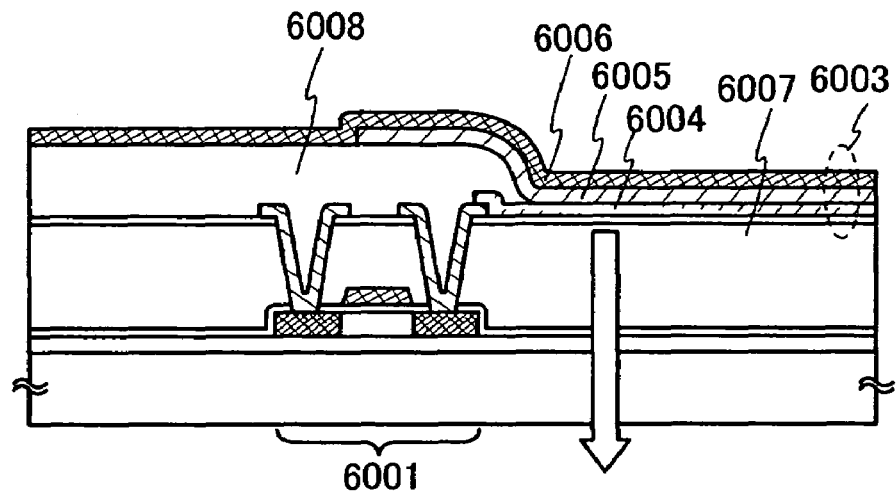
FIGS. 9A to 9C are sectional views of a pixel included in a light-emitting device of the invention.
Figure 9B:
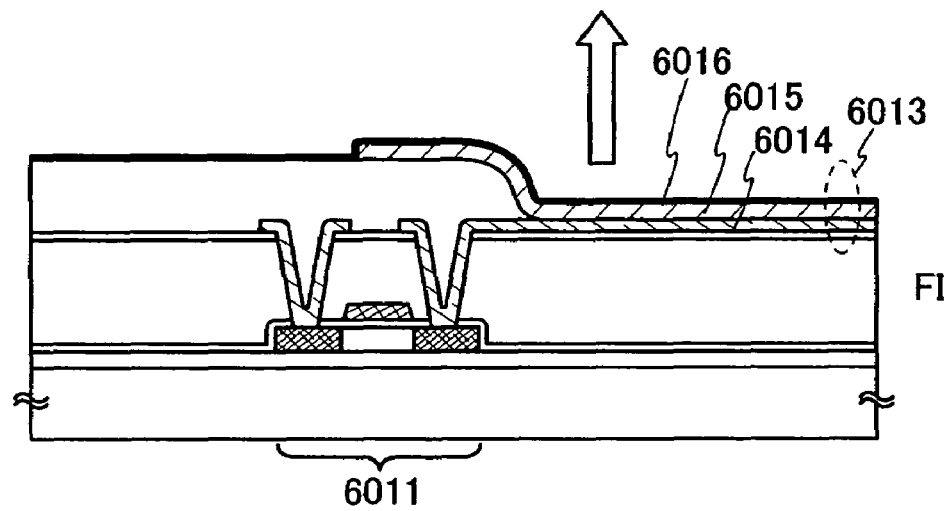
Figure 9C:
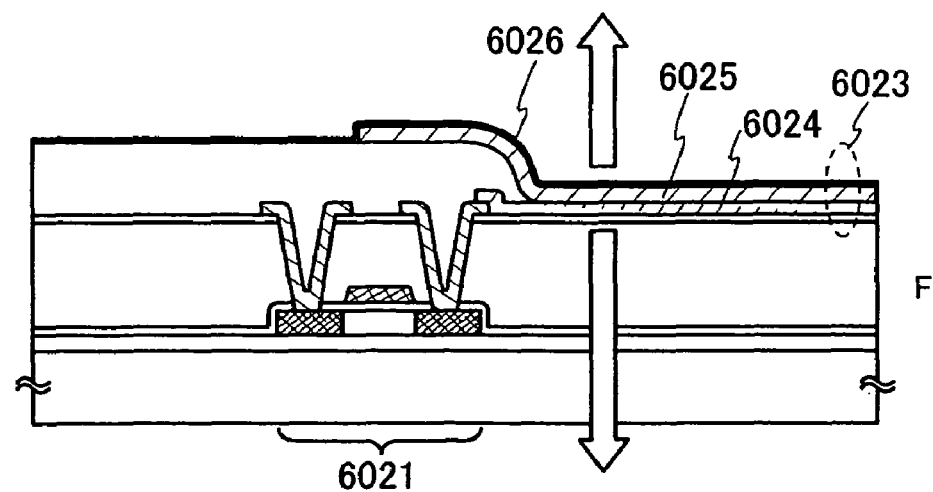

In this embodiment, description is made with reference to FIGS. 9A to 9C on the sectional structure of a pixel in the case where a P-channel driving transistor is employed. Note that FIGS. 9A to 9C each illustrates the case where a first electrode is an anode while the second electrode is a cathode; however, the first electrode may be a cathode while the second electrode may be an anode.

FIG. 9A is a sectional diagram of a pixel in the case where a P-channel transistor is used as a driving transistor 6001, and light emitted from a light-emitting element 6003 is extracted from a first electrode 6004.

The driving transistor 6001 is covered with an interlayer insulating film 6007, over which a bank 6008 having an opening portion is formed. In the opening portion of the bank 6008, the first electrode 6004 is partially exposed, and the first electrode 6004, an electroluminescent layer 6005, and a second electrode 6006 are stacked in this order.

The interlayer insulating film 6007 can be formed of an organic resin film, an inorganic insulating film, or an insulating film formed of a siloxane-based material as a starting material and having Si—O—Si bond (hereinafter referred to as a siloxane insulating film). Siloxane may include as a substituent an organic group containing at least hydrogen (e.g., alkyl group or aromatic hydrocarbon). Alternatively, a fluoro group may be used as the substituent as well as both the fluoro group and the organic group containing at least hydrogen. The interlayer insulating film 6007 may be formed using a low dielectric constant material (low-k material).

The bank 6008 can be formed using an organic resin film, an inorganic insulating film, or a siloxane insulating film. The organic resin film includes, for example, acrylic, polyimide, polyamide, and the like while the inorganic insulating film includes silicon oxide, silicon nitride oxide, and the like. In particular, by forming the bank 6008 using a photosensitive organic resin film, forming an opening portion on the first electrode 6004, and controlling a sidewall of the opening portion to have a gradient with a continuously variable curvature, it can be prevented that the first electrode 6004 is short-circuited to the second electrode 6006.

The first electrode 6004 is formed with a material or a thickness to transmit light, which is suitable for being used as an anode. For example, the first electrode 6004 can be formed using indium tin oxide (ITO), zinc oxide (ZnO), indium zinc oxide (IZO), gallium-doped zinc oxide (GZO), or other light-transmissive conductive oxide. Alternatively, the first electrode 6004 may be formed using indium tin oxide containing silicon oxide (hereinafter referred to as ITSO), or a mixture of indium oxide containing silicon oxide and 2 to 20% of zinc oxide (ZnO). In addition to the aforementioned light-transmissive conductive oxide, the first electrode 6004 may be formed using a single-layer film containing one or more of TiN, ZrN, Ti, W, Ni, Pt, Cr, Ag, Al, and the like, a stacked-layer structure of a titanium nitride film and a film containing aluminum as its main component, or a three-layer structure of a titanium nitride film, a film containing aluminum as its main component, and a titanium nitride film. However, in the case of using a material other than the light-transmissive conductive oxide, the first electrode 6004 is formed thin enough to transmit light (preferably, about 5 to 30 nm).

The second electrode 6006 is formed with a material or a thickness to reflect or shied light. For example, metals, alloys, electrically conductive compounds, or a mixture of them each having a low work function can be used. Specifically, alkaline metals such as Li and Cs, alkaline earth metals such as Mg, Ca and Sr, alloys containing such metals (e.g., Mg:Ag, Al:Li, or Mg:In), compounds of such materials (e.g., $CaF_2$ or CaN), or rare earth metals such as Yb and Er can be used. In the case of providing an electron-injection layer, other conductive layers such as an Al layer may be employed as well.

The electroluminescent layer 6005 is formed in a single layer or a plurality of layers. When the electroluminescence layer 6005 has a plurality of layers, the layers can be classified into a hole-injection layer, a hole-transporting layer, a light-emitting layer, an electron-transporting layer, an electron-injection layer and the like in terms of the carrier transporting properties. When the electroluminescent layer 6005 has any of the hole-injection layer, the hole-transporting layer, the electron-transporting layer, and the electron-injection layer, the hole-injection layer, the hole-transporting layer, the light-emitting layer, the electron-transporting layer, and the electron-injection layer are formed in this order on the first electrode 6004. Note that the interface between each layer is not necessarily distinct, and there might be a case where a material forming each layer is partially mixed into the adjacent layer, in which case the interface between each layer is unclear. Each layer may be formed using an organic material, or an inorganic material. As the organic material, any of a high molecular weight organic material, a medium molecular weight organic material, and a low molecular weight organic material can be used. Note that the medium molecular weight material means a low polymer having repeated structural units (the degree of polymerization) of about 2 to 20. There is no clear distinction between the hole-injection layer and the hole transporting layer, and both of them inevitably have a hole transporting property (hole mobility). The hole-injection layer is in contact with the anode, and a layer in contact with the hole-injection layer is distinguished as a hole transporting layer for convenience. The same applies to the electron-transporting layer and the electron-injection layer. A layer in contact with the cathode is called an electron-injection layer while a layer in contact with the electron-injection layer is called an electron-transporting layer. In some cases, the light-emitting layer may combine the function of the electron-transporting layer, and it is therefore called a light-emitting electron-transporting layer.

In the case of the pixel shown in FIG. 9A, light emitted from the light-emitting element 6003 can be extracted from the first electrode 6004 as shown by a hollow arrow.

FIG. 9B illustrates a cross-sectional diagram of a pixel in the case where a P-channel transistor is used as a driving transistor 6011, and light emitted from a light-emitting element 6013 is extracted from a second electrode 6016. On the first electrode 6014, an electroluminescent layer 6015 and the second electrode 6016 are stacked in this order.

The first electrode 6014 is formed with a material or a thickness to reflect or shield light, which is suitable for being used as an anode. For example, the first electrode 6014 may be formed of a single-layer film containing one or more of TiN, ZrN, Ti, W, Ni, Pt, Cr, Ag, Al, and the like, a stacked-layer structure of a titanium nitride film and a film containing aluminum as its main component, or a three-layer structure of a titanium nitride film, a film containing aluminum as its main component, and a titanium nitride film.

The second electrode 6016 is formed with a material or a thickness to transmit light. For example, metals, alloys, electrically conductive compounds, or a mixture of them each having a low work function can be used. Specifically, alkaline metals such as Li and Cs, alkaline earth metals such as Mg, Ca and Sr, alloys containing such metals (e.g., Mg:Ag, Al:Li, or Mg:In), compounds of such materials (e.g., $CaF_2$ or CaN), or rare earth metals such as Yb and Er can be used. In the case of providing an electron-injection layer, other conductive layers such as an Al layer may be employed as well. The second electrode 6016 is formed thin enough to transmit light (preferably about 5 to 30 nm). Note that the second electrode 6016 can also be formed using indium tin oxide (ITO), zinc oxide (ZnO), indium zinc oxide (IZO), gallium-doped zinc oxide (GZO), or other light-transmissive conductive oxide. Alternatively, the second electrode 6016 may be formed using indium tin oxide containing silicon oxide (ITSO), or a mixture of indium oxide containing silicon oxide and 2 to 20% of zinc oxide (ZnO). In the case of using the light-transmissive conductive oxide, the electroluminescent layer 6015 is desirably provided with an electron-injection layer.

The electroluminescent layer 6015 can be formed in a similar manner to the electroluminescent layer 6005 in FIG. 9A.

In the case of the pixel shown in FIG. 9B, light emitted from the light-emitting element 6013 can be extracted from the second electrode 6016 as shown by a hollow arrow.

FIG. 9C illustrates a cross-sectional diagram of a pixel in the case where a P-channel transistor is employed as a driving transistor 6021, and light emitted from a light-emitting element 6023 is extracted from both sides of a first electrode 6024 and a second electrode 6026. On the first electrode 6024, an electroluminescent layer 6025 and a second electrode 6026 are stacked in this order.

The first electrode 6024 may be formed in a similar manner to the first electrode 6004 shown in FIG. 9A. The second electrode 6026 may be formed in a similar manner to the second electrode 6016 shown in FIG. 9B. In addition, the electroluminescent layer 6025 may also be formed in a similar manner to the electroluminescent layer 6005 shown in FIG. 9A.

In the case of the pixel shown in FIG. 9C, light emitted from the light-emitting element 6023 can be extracted from both sides of the first electrode 6024 and the second electrode 6024 as shown by hollow arrows.

This embodiment can be implemented in combination with the aforementioned embodiment mode or embodiments.

Embodiment 4

Figure 10A:
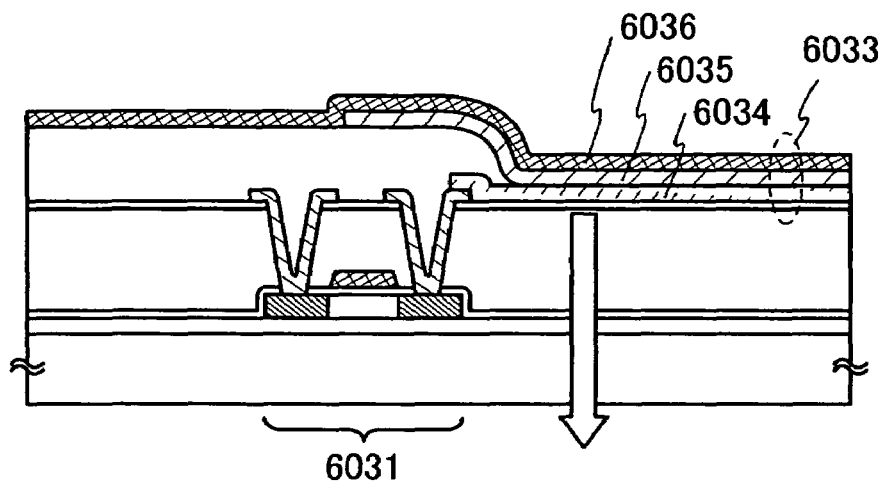
FIGS. 10A to 10C are sectional views of a pixel included in a light-emitting device of the invention.
Figure 10B:
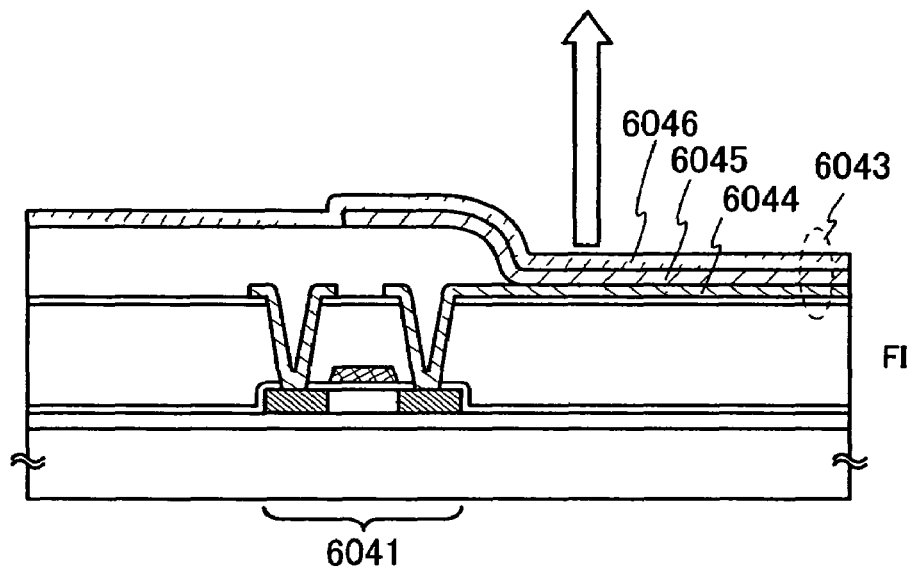
Figure 10C:
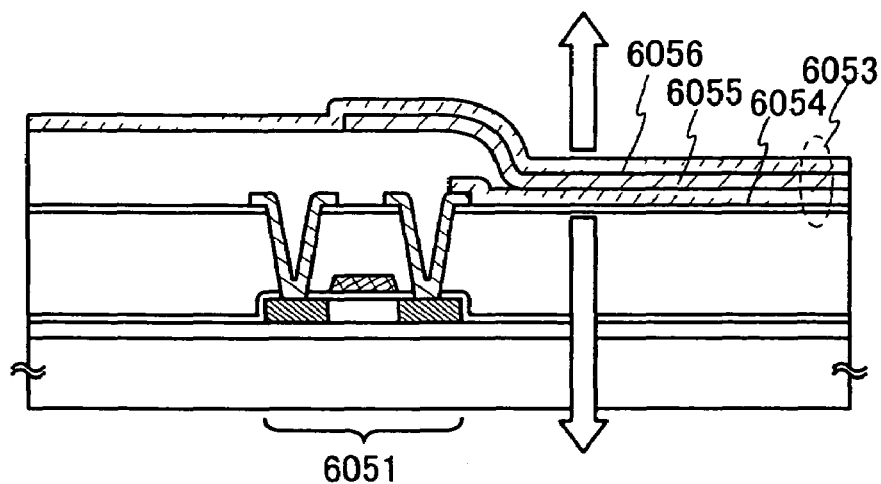

In this embodiment, description is made with reference to FIGS. 10A to 10C on the cross-sectional structure of a pixel in the case where an N-channel driving transistor is employed.

Note that FIGS. 10A to 10C each illustrates the case where the first electrode is a cathode while the second electrode is an anode; however, the first electrode may be an anode while the second electrode may be a cathode.

FIG. 10A illustrates a cross-sectional diagram of a pixel in the case where an N-channel transistor is employed as a driving transistor 6031, and light emitted from a light-emitting element 6033 is extracted from a first electrode 6034. On the first electrode 6034, an electroluminescent layer 6035 and a second electrode 6036 are stacked in this order.

The first electrode 6034 is formed with a material or a thickness to transmit light. For example, metals, alloys, electrically conductive compounds, or a mixture of them each having a low work function may be used. Specifically, alkaline metals such as Li and Cs, alkaline earth metals such as Mg, Ca and Sr, alloys containing such metals (e.g., Mg:Ag, Al:Li, or Mg:In), compounds of such metals ($CaF_2$ or CaN), or rare-earth metals such as Yb and Er can be employed. In the case of providing an electron-injection layer, other conductive layers such as an Al layer can be employed as well. The first electrode 6034 is formed thin enough to transmit light (preferably about 5 to 30 nm). Further, a light-transmissive conductive layer may be formed using a light-transmissive conductive oxide so as to be in contact with the top or bottom surface of the aforementioned conductive layer having a thickness to transmit light, thereby suppressing sheet resistance of the first electrode 6034. Note that the first electrode 6034 may also be formed using indium tin oxide (ITO), zinc oxide (ZnO), indium zinc oxide (IZO), gallium-doped zinc oxide (GZO), or other light-transmissive conductive oxide. Alternatively, the first electrode 6034 may be formed using indium tin oxide containing silicon oxide (ITSO), or a mixture of indium oxide containing silicon oxide and 2 to 20% of zinc oxide (ZnO). In the case of using the light-transmissive conductive oxide, the electroluminescent layer 6035 is desirably provided with an electron-injection layer.

The second electrode 6036 is formed with a material or a thickness to reflect or shield light, which is suitable for being used as an anode. For example, the second electrode 6036 may be formed of a single-layer film containing one or more of TiN, ZrN, Ti, W, Ni, Pt, Cr, Ag, Al, and the like, a stacked-layer structure of a titanium nitride film and a film containing aluminum as its main component, or a three-layer structure of a titanium nitride film, a film containing aluminum as its main component, and a titanium nitride film.

The electroluminescent layer 6035 can be formed in a similar manner to the electroluminescent layer 6005 in FIG. 9A. However, in the case where the electroluminescent layer 6035 has any of a hole-injection layer, a hole-transporting layer, an electron-transporting layer, and an electron-injection layer in addition to the light-emitting layer, the electron-injection layer, the electron-transporting layer, the light-emitting layer, the hole-transporting layer, and the hole-injection layer are stacked in this order.

In the case of the pixel shown in FIG. 10A, light emitted from the light-emitting element 6033 can be extracted from the first electrode 6034 as shown by a hollow arrow.

FIG. 10B illustrates a cross-sectional diagram of a pixel in the case where an N-channel transistor is employed as a driving transistor 6041, and light emitted from a light-emitting element 6043 is extracted from a second electrode 6046. On the first electrode 6044, the electroluminescent layer 6045 and the second electrode 6046 are formed in this order.

The first electrode 6044 is formed with a material or a thickness to reflect or shield light. For example, metals, alloys, electrically conductive compounds, or a mixture of them each having a low work function can be used. Specifically, alkaline metals such as Li and Cs, alkaline earth metals such as Mg, Ca and Sr, alloys containing such metals (e.g., Mg:Ag, Al:Li, or Mg:In), compounds of such materials (e.g., $CaF_2$ or CaN), or rare earth metals such as Yb and Er can be used. In the case of providing an electron-injection layer, other conductive layers such as an Al layer may be employed as well.

The second electrode 6046 is formed with a material or a thickness to transmit light, which is suitable for being used as an anode. For example, the second electrode 6046 can be formed using indium tin oxide (ITO), zinc oxide (ZnO), indium zinc oxide (IZO), gallium-doped zinc oxide (GZO), or other light-transmissive conductive oxide. Alternatively, the second electrode 6046 may be formed using indium tin oxide containing silicon oxide (ITSO), or a mixture of indium oxide containing silicon oxide and 2 to 20% of zinc oxide (ZnO). In addition to the aforementioned light-transmissive conductive oxide, the second electrode 6046 may be formed of a single-layer film containing one or more of TiN, ZrN, Ti, W, Ni, Pt, Cr, Ag, Al, and the like, a stacked-layer structure of a titanium nitride film and a film containing aluminum as its main component, or a three-layer structure of a titanium nitride film, a film containing aluminum as its main component, and a titanium nitride film. However, in the case of using a material other than the light-transmissive conductive oxide, the second electrode 6046 is formed thin enough to transmit light (preferably, about 5 to 30 nm).

The electroluminescent layer 6045 can be formed in a similar manner to the electroluminescent layer 6035 in FIG. 10A.

In the case of the pixel shown in FIG. 10B, light emitted from the light-emitting element 6043 can be extracted from the second electrode 6046 as shown by a hollow arrow.

FIG. 10C illustrates a cross-sectional diagram of a pixel in the case where an N-channel transistor is employed as a driving transistor 6051, and light emitted from a light-emitting element 6053 is extracted from both sides of a first electrode 6054 and a second electrode 6056. On the first electrode 6054, the electroluminescent layer 6055 and the second electrode 6056 are formed in this order.

The first electrode 6054 can be formed in a similar manner to the first electrode 6034 in FIG. 10A. The second electrode 6056 can be formed in a similar manner to the second electrode 6046 in FIG. 10B. The electroluminescent layer 6055 can be formed in a similar manner to the electroluminescent layer 6035 in FIG. 10A.

In the case of the pixel shown in FIG. 10C, light emitted from the light-emitting element 6053 can be extracted from both sides of the first electrode 6054 and the second electrode 6056 as shown by hollow arrows.

This embodiment can be implemented in combination with the aforementioned embodiment mode or embodiments.

Embodiment 5

The light-emitting device of the invention can be formed by using a printing method typified by screen printing and offset printing, or a droplet discharge method. The droplet discharge method is a method for forming a predetermined pattern by discharging droplets containing a predetermined composition from an orifice, which includes an ink-jet deposition method. When using such a printing method or a droplet discharge method, various wirings typified by signal lines, scan lines, and power supply lines, a gate electrode of a TFT, an electrode of a light-emitting element, and the like can be formed. However, the printing method or the droplet discharge method is not necessarily used for the whole steps for forming patterns. Accordingly, such process is possible that wirings and a gate electrode are formed by the printing method or the droplet discharge method while a semiconductor film is patterned by lithography, in which case the printing method or the droplet discharge method is used at least for a part of the steps, and lithography is combined. Further, a mask used for patterning may be formed by the printing method or the droplet discharge method as well.

Figure 11:
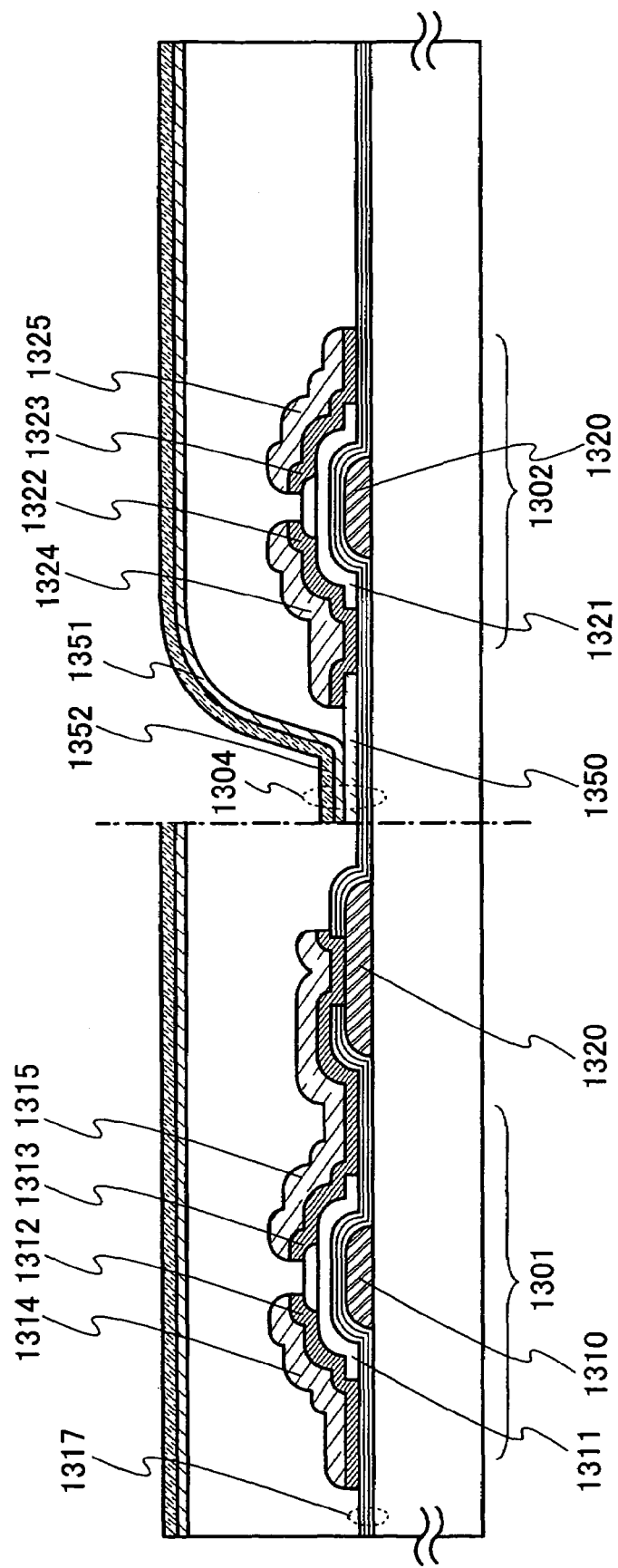
FIG. 11 is a sectional view of a pixel included in a light-emitting device of the invention.

FIG. 11 illustrates an exemplary cross-sectional diagram of the light-emitting device of the invention formed using the droplet discharge method. In FIG. 11, reference numeral 1301 denotes a switching transistor, 1302 denotes a driving transistor, and 1304 denotes a light-emitting element. The driving transistor 1302 is desirably an N-channel transistor, in which case it is desirable that a first electrode 1350 be a cathode while a second electrode 1331 be an anode.

The switching transistor 1301 includes a gate 1310, a first semiconductor film 1311 including a channel formation region, a gate insulating film 1317 formed between the gate 1310 and the first semiconductor film 1311, second semiconductor films 1312 and 1313 functioning as a source or a drain, a wiring 1314 connected to the second semiconductor film 1312, and a wiring 1315 connected to the second semiconductor film 1313.

The driving transistor 1302 includes a gate 1320, a first semiconductor film 1321 including a channel formation region, the gate insulating film 1317 formed between the gate 1320 and the first semiconductor film 1321, second semiconductor films 1322 and 1323 functioning as a source or a drain, a wiring 1324 connected to the second semiconductor film 1322, and a wiring 1325 connected to the second semiconductor film 1323.

The wiring 1314 corresponds to a signal line, and the wiring 1315 is electrically connected to the gate 1320 of the transistor 1302. The wiring 1325 corresponds to a power supply line.

The wiring 1324 is connected to the first electrode 1350 of the light-emitting element 1304. On the first electrode 1350, an electroluminescent layer 1351 and the second electrode 1352 are formed in this order. The stacked layers of the first electrode 1350, the electroluminescent layer 1351, and the second electrode 1352 constitute the light-emitting element 1304.

By forming patterns using the droplet discharge method or the printing method, a series of steps such as lithography steps including photoresist coating, exposure and development, an etching step and a peeling step can be simplified. In addition, when adopting the droplet discharge method or the printing method, waste of materials that would otherwise be removed by etching can be avoided unlike the case of lithography. Further, since an expensive mask for exposure is not required, manufacturing cost of the light-emitting device can be suppressed.

Further, unlike lithography, etching steps for forming wirings are not required. Accordingly, time required for formation steps of wirings can be significantly reduced as compared to the case of performing lithography. In particular, when forming the wirings with a thickness of 0.5 μm or thicker, and more desirably 2 μm or thicker, the wiring resistance can be suppressed; therefore, increase in wiring resistance along with the enlargement of the light-emitting device can be suppressed while suppressing the time required for the formation steps of the wirings.

Note that each of the first semiconductor films 1311 and 1321 may be either an amorphous semiconductor or a semi-amorphous semiconductor (SAS).

An amorphous semiconductor can be obtained by decomposing a silicon source gas by glow discharge. As the typical silicon source gas, $SiH_4$ or $Si_2H_6$ can be employed. The silicon source gas may be diluted with hydrogen, or hydrogen and helium.

An SAS can also be obtained by decomposing a silicon source gas by glow discharge. As the typical silicon source gas, $SiH_4$ can be used as well as other silicon source gas such as $Si_2H_6$, $SiH_2Cl_2$, $SiHCl_3$, $SiCl_4$, and $SiF_4$. In addition, manufacture of the SAS can be facilitated when the silicon source gas is diluted with a mixed gas of hydrogen and a noble-gas element selected from one or more of helium, argon, krypton and neon. The silicon source gas is preferably diluted to a ratio of 2 to 1000 times. Further, the silicon source gas may be mixed with a carbon source gas such as $CH_4$ and $C_2H_6$, a germanium source gas such as $GeH_4$ and $GeF_4$, or $F_2$ while controlling the energy bandwidth to be 1.5 to 2.4 eV or 0.9 to 1.1 eV. A TFT using an SAS as the first semiconductor layer can obtain the mobility of 1 to 10 $cm^2$/Vsec or higher.

In addition, the first semiconductor films 1311 and 1321 may be formed using a semiconductor obtained by irradiating an amorphous semiconductor or a semi-amorphous semiconductor (SAS) with laser.

This embodiment can be implemented in combination with the aforementioned embodiment mode or embodiments.

Embodiment 6

In this embodiment, description is made with reference to FIGS. 12A and 12B on the exterior view of a panel which corresponds to one mode of the light-emitting device of the invention. FIG. 12A illustrates a top view of a panel obtained by sealing a first substrate over which transistors and light-emitting elements are formed, and a second substrate with a sealant. FIG. 12B illustrates a cross-sectional diagram of FIG. 12A along a line A-A'.

A sealant 4020 is provided so as to surround a pixel portion 4002, a signal line driver circuit 4003, a first scan line driver circuit 4004, and a second scan line driver circuit 4005 formed over a first substrate 4001. In addition, a second substrate 4006 is provided over the pixel portion 4002, the signal line driver circuit 4003, the first scan line driver circuit 4004, and the second scan line driver circuit 4005. Accordingly, the pixel portion 4002, the signal line driver circuit 4003, the first scan line driver circuit 4004, and the second scan line driver circuit 4005 are tightly sealed together with a filler 4007 by the first substrate 4001, the sealant 4020, and the second substrate 4006.

Each of the pixel portion 4002, the signal line driver circuit 4003, the first scan line driver circuit 4004, and the second scan line driver circuit 4005 formed over the first substrate 4001 has a plurality of transistors. FIG. 12B illustrates a transistor 4008 included in the signal line driver circuit 4003, a driving transistor 4009 included in the pixel portion 4002, and a driving transistor 4009 and a switching transistor 4010 included in the pixel portion 4002.

Reference numeral 4011 corresponds to a light-emitting element. A wiring 4017 connected to a drain of the driving transistor 4009 partially functions as a first electrode of the light-emitting element 4011. In addition, a light-transmissive conductive film functions as a second electrode 4012 of the light-emitting element 4011. Note that the structure of the light-emitting element 4011 is not limited to the one shown in this embodiment. The structure of the light-emitting element 4011 may be changed appropriately in accordance with the direction of light emitted from the light-emitting element 4011 and the conductivity of the driving transistor 4009.

Various signals and voltages supplied to the signal line driver circuit 4003, the first scan line driver circuit 4004, the second scan line driver circuit 4005, or the pixel portion 4002 are not shown in the cross-sectional diagram in FIG. 12B; however, they are supplied from a connecting terminal 4016 through lead wirings 4014 and 4015.

In this embodiment, the connecting terminal 4016 is formed of the same conductive film as the second electrode 4012 of the light-emitting element 4011. The lead wiring 4014 is formed of the same conductive film as the wiring 4017. The lead wiring 4015 is formed of the same conductive film as the respective gates of the driving transistor 4009, the switching transistor 4010, and the transistor 4008.

The connecting terminal 4016 is electrically connected to a terminal of an FPC 4018 through an anisotropic conductive film 4019.

Note that each of the first substrate 4001 and the second substrate 4006 may be formed of glass, metals (typically, stainless), ceramics, plastics, and the like. As for the plastics, an FRP (Fiberglass-Reinforced Plastics) substrate, a PVF (Polyvinylfluoride) film, a mylar film, a polyester film or an acrylic resin film may be employed. In addition, a sheet having a structure that aluminum is sandwiched by a PVF film or a mylar film can be employed.

Note that the second substrate 4006, which is disposed on the side from which light emitted from the light-emitting element 4011 is extracted, is required to transmit light. In this case, the second substrate 4006 is formed using a light-transmissive material such as a glass substrate, a plastic substrate, a polyester film, and an acrylic film.

As the filler 4007, inert gas such as a nitrogen gas and an argon gas, an ultraviolet curable resin, or a heat curable resin can be used such as PVC (Polyvinyl Chloride), acrylic, polyimide, an epoxy resin, a silicone resin, PVB (Polyvinyl Butyral) and EVA (Ethylene Vinyl Acetate). In this embodiment, a nitrogen gas is employed as the filler.

This embodiment can be implemented in combination with the aforementioned embodiment mode or embodiments.

Embodiment 7

Figure 14A:
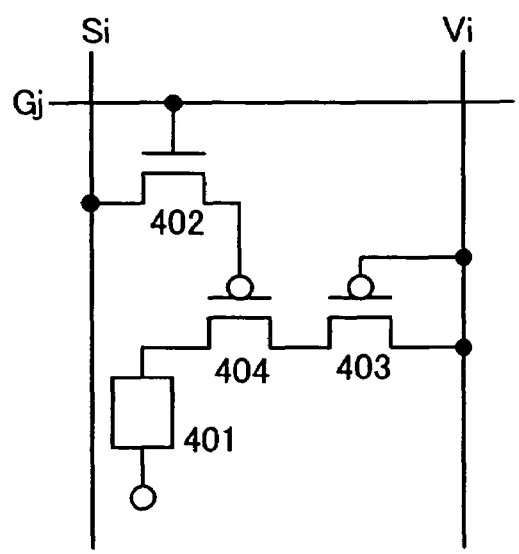
FIGS. 14A and 14B are circuit diagrams of a pixel included in a light-emitting device of the invention.

A pixel included in the light-emitting device of the invention is not limited to the configuration shown in FIG. 3. FIG. 14A illustrates one mode of a pixel included in the light-emitting device of the invention. The pixel shown in FIG. 14A includes a light-emitting element 401, a switching transistor 402, a driving transistor 403, and a current-controlling transistor for selecting whether or not to supply current to the light-emitting element 401. In addition, a capacitor for holding voltage of a video signal may be formed in the pixel though not shown.

The driving transistor 403 and the current-controlling transistor 404 may have the same conductivity or different conductivity. The driving transistor 403 is operated in the saturation region while the current-controlling transistor 404 is operated in the linear region. Note that the driving transistor 403 is desirably operated in the saturation region; however, the invention is not limited to such a configuration, and the driving transistor 403 may be operated in the linear region. In addition, the switching transistor 402 is operated in the linear region. The switching transistor 402 may be either an N-channel transistor or a P-channel transistor.

As shown in FIG. 14A, when the driving transistor 403 is a P-channel transistor, it is desirable that the anode of the light-emitting element 401 be the first electrode while the cathode thereof be the second electrode. On the other hand, when the driving transistor 403 is an N-channel transistor, it is desirable that the cathode of the light-emitting element 401 be the first electrode while the anode thereof be the second electrode.

The gate of the switching transistor 402 is connected to a scan line Gj (j=1 to y). One of the source and drain of the switching transistor 402 is connected to a signal line Si (i=1 to x) while the other is connected to the gate of the current-controlling transistor 404. The gate of the driving transistor 403 is connected to a power supply line Vi (i=1 to x). The driving transistor 403 and the current-controlling transistor 404 are connected to the power supply line Vi and the light-emitting element 401 so that current supplied from the power supply line Vi is supplied to the light-emitting element 401 as the drain current of the driving transistor 403 and the current-controlling transistor 404. In this embodiment mode, the source of the driving transistor 403 is connected to the power supply line Vi, and the current-controlling transistor 404 is provided between the driving transistor 403 and the first electrode of the light-emitting element 401.

When forming a capacitor, one of two electrodes of the capacitor is connected to the power supply line Vi while the other is connected to the gate of the current-controlling transistor 404. The capacitor is provided for holding the gate voltage of the current-controlling transistor 404.

Figure 14B:
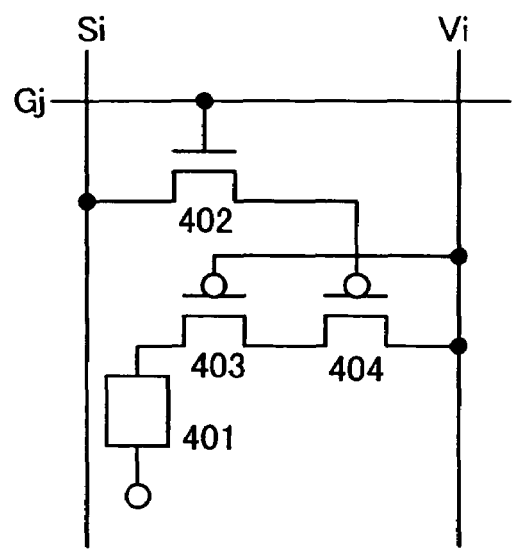

Note that the configuration of the pixel shown in FIG. 14A is only one mode of the invention; therefore, the light-emitting device of the invention is not limited to FIG. 14A. For example, as shown in FIG. 14B, the drain of the driving transistor 403 is connected to the first electrode of the light-emitting element 401, and the current-controlling transistor 404 may be provided between the driving transistor 403 and the power supply line Vi. Note that the same components between FIG. 14A and FIG. 14B are given the same reference numerals.

This embodiment can be implemented in combination with the aforementioned embodiment mode or embodiments.

Embodiment 8

The semiconductor display device of the invention can suppress power consumption while enhancing the contrast, and further can suppress the generation of pseudo-contours; therefore, it can be suitably used as a display portion of a portable telephone, a portable game machine, or a handy-size portable electronic appliance such as an electronic book, a video camera, and a digital still camera. Further, since the semiconductor display device of the invention can suppress the generation of pseudo-contours, it can be suitably used as an electronic appliance such as a display device capable of reproducing moving images and having a display portion for displaying the reproduced image.

As other semiconductor display devices to which the invention can be applied, there are a video camera, a digital camera, a goggle display (e.g., head mounted display), a navigation system, an audio reproducing device (e.g., car audio and component stereo set), a laptop computer, a game machine, and an image reproducing device equipped with a recording medium (typically, a device reproducing a recording medium such as a DVD (Digital Versatile Disc), and having a display portion for displaying the reproduced image). Specific examples of such electronic appliances are shown in FIGS. 13A to 13C.

Figure 13A:
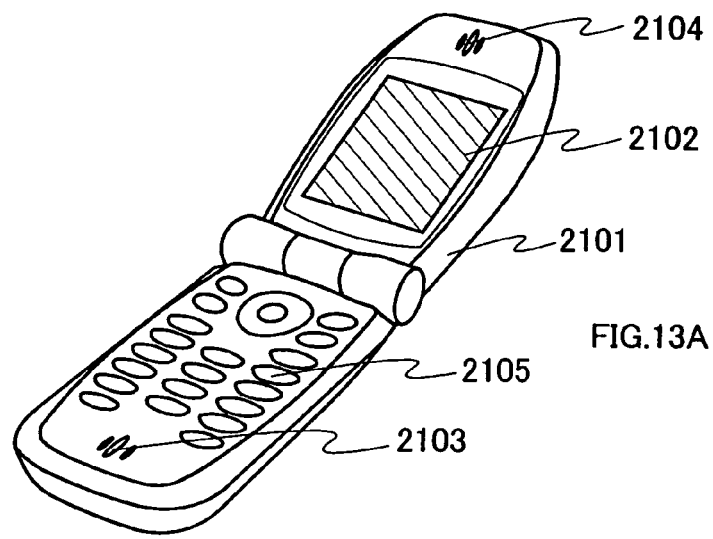
FIGS. 13A to 13C are views of electronic appliances to each of which a semiconductor display device of the invention is applied.

FIG. 13A illustrates a portable telephone which includes a main body 2101, a display portion 2102, an audio input portion 2103, an audio output portion 2104, an operating key 2105, and the like. By forming the display portion 2102 using the semiconductor display device of the invention, a portable telephone as one mode of the electronic appliance of the invention can be completed.

Figure 13B:
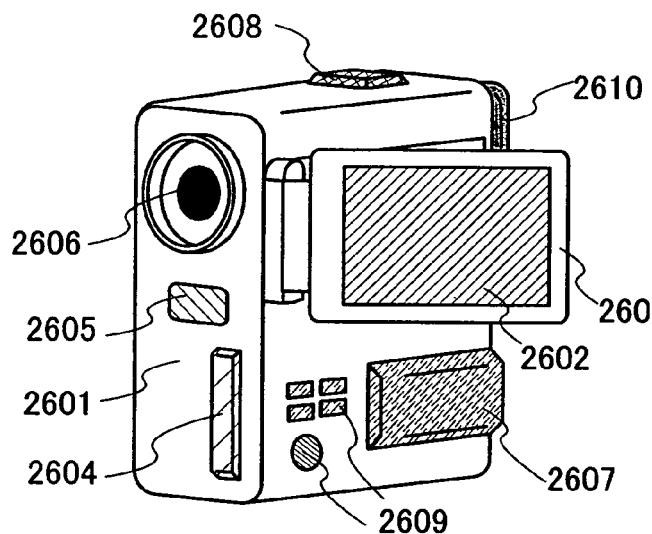

FIG. 13B illustrates a video camera which includes a main body 2601, a display portion 2602, a housing 2603, an external connecting port 2604, a remote control receiving portion 2605, an image receiving portion 2606, a battery 2607, an audio input portion 2608, an operating key 2609, an eyepiece portion 2610, and the like. By forming the display portion 2602 using the semiconductor display device of the invention, a video camera as one mode of the electronic appliance of the invention can be completed.

Figure 13C:
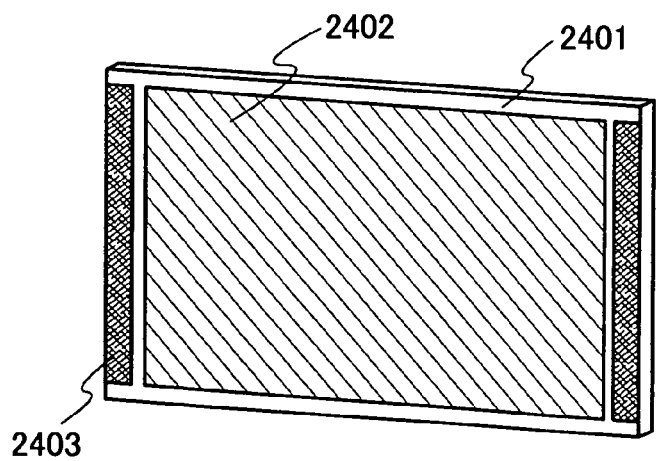

FIG. 13C illustrates a display device which includes a housing 2401, a display portion 2402, a speaker portion 2403, and the like. By forming the display portion 2402 using the semiconductor display device of the invention, a display device as one mode of the electronic appliance of the invention can be completed. Note that the display device includes all information display devices for personal computer, TV broadcast reception, advertisement, and the like.

As set forth above, the applicable range of the invention is so wide that the invention can be used as electronic appliances of various fields.

This embodiment can be implemented in combination with the aforementioned embodiment mode or embodiments.

The present application is based on Japanese Priority application No. 2004-187757 filed on Jun. 25, 2004 with the Japanese Patent Office, the entire contents of which are hereby incorporated by reference.

What is claimed is:

1. A semiconductor display device comprising:
a pixel portion;
a signal line driver circuit;
a first scan line driver circuit; and
a second scan line driver circuit,
wherein the pixel portion includes a plurality of pixels disposed in rows and columns, which are respectively connected to the signal line driver circuit through signal lines and to the first scan line driver circuit and the second scan line driver circuit through scan lines;
the plurality of pixels are selected per row by the first scan line driver circuit;
the plurality of pixels are selected per row by the second scan line driver circuit;
writing of a first video signal to a row selected by the first scan line driver circuit is controlled by the signal line driver circuit;
writing of a second video signal to a row selected by the second scan line driver circuit is controlled by the signal line driver circuit;
the first scan line driver circuit includes a first selection circuit;
the second scan line driver circuit includes a second selection circuit;
a row writing period for inputting x video signals to x pixels provided in one row is divided into a first row writing period and a second row writing period where x is the number of pixels in one row;
an output from the second scan line driver circuit to the plurality of pixels is set at high impedance by the second selection circuit included in the second scan line driver circuit while the row is selected by the first scan line driver circuit during the first row writing period wherein a first signal is inputted into the row through the first selection circuit from a first selection signal generating circuit provided in the first scan line driver circuit during the first row writing period; and
an output from the first scan line driver circuit to the plurality of pixels is set at high impedance by the first selection circuit included in the first scan line driver circuit while the row is selected by the second scan line driver circuit during the second row writing period wherein a second signal is inputted into the row through the second selection circuit from a second selection signal generating circuit provided in the second scan line driver circuit during the second row writing period.

2. A device according to claim 1, wherein the row selected by the first scan line driver circuit is different from the row selected by the second scan line driver circuit.

3. A device according to claim 1, wherein the selection circuit includes a tri-state gate.

4. An electronic appliance using the semiconductor display device according to claim 1.

5. A device according to claim 1 wherein each of the plurality of pixels comprises a light-emitting element.

6. A device according to claim 1 wherein the semiconductor display device is incorporated into one selected from the group consisting of a portable telephone and a camera.

7. A semiconductor display device comprising:
a pixel portion;
a signal line driver circuit;
a first scan line driver circuit; and
a second scan line driver circuit,
wherein the pixel portion includes a plurality of pixels disposed in rows and columns, which are respectively connected to the signal line driver circuit through signal lines and to the first scan line driver circuit and the second scan line driver circuit through scan lines;
the plurality of pixels are selected per row by the first scan line driver circuit;
the plurality of pixels are selected per row by the second scan line driver circuit;
writing of a first video signal to a row selected by the first scan line driver circuit is controlled by the signal line driver circuit;
writing of a second video signal to a row selected by the second scan line driver circuit is controlled by the signal line driver circuit;
the first scan line driver circuit includes a first selection circuit;
the second scan line driver circuit includes a second selection circuit;
a row writing period for inputting x video signals to x pixels provided in one row is divided into a first row writing period and a second row writing period where x is the number of pixels in one row;
an output from the second scan line driver circuit to the plurality of pixels is set at high impedance by the second selection circuit included in the second scan line driver circuit while the row is selected by the first scan line driver circuit during the first row writing period wherein a first signal at H level or L level is inputted into the row through the first selection circuit from a first selection signal generating circuit provided in the first scan line driver circuit during the first row writing period; and
an output from the first scan line driver circuit to the plurality of pixels is set at high impedance by the first selection circuit included in the first scan line driver circuit while the row is selected by the second scan line driver circuit during the second row writing period wherein a second signal at H level or L level is inputted into the row through the second selection circuit from a second selection signal generating circuit provided in the second scan line driver circuit during the second row writing period.

8. A device according to claim 7, wherein the row selected by the first scan line driver circuit is different from the row selected by the second scan line driver circuit.

9. A device according to claim 7, wherein the selection circuit includes a tri-state gate.

10. An electrode appliance using the semiconductor display device according to claim 7.

11. A device according to claim 7 wherein each of the plurality of pixels comprises a light-emitting element.

12. A device according to claim 7 wherein the semiconductor display device is incorporated into one selected from the group consisting of a portable telephone and a camera.

13. A semiconductor display device comprising:
a pixel portion;
a signal line driver circuit;
a first scan line driver circuit; and
a second scan line driver circuit, wherein the pixel portion includes a plurality of pixels disposed in rows and columns, which are respectively connected to the signal line driver circuit and through signal lines and to the first scan line driver circuit and the second scan line driver circuit though scan lines;

each of the plurality of pixels comprises a light-emitting element;

the plurality of pixels are selected per row by the first scan line driver circuit;

the plurality of pixels are selected per row by the second scan line driver circuit;

writing of a first video signal to a row selected by the first scan line driver circuit is controlled by the signal line driver circuit;

writing of a second video signal to a row selected by the second scan line driver circuit is controlled by the signal line driver circuit;

luminance of the light-emitting element is controlled by the first video signal or the second video signal;

the first scan line driver circuit includes a first selection circuit;

the second scan line driver circuit includes a second selection circuit;

a row writing period for inputting x video signals to x pixels provided in one row is divided into a first row writing period and a second row writing period where x is the number of pixels in one row;

an output from the second scan line driver circuit to the plurality of pixels is set at high impedance by the second selection circuit included in the second scan line driver circuit while the row is selected by the first scan line driver circuit during the first row writing period wherein a first signal is inputted into the row through the first selection circuit from a first selection signal generating circuit provided in the first scan line driver circuit during the first row writing period; and an output from the first scan line driver circuit to the plurality of pixels is set at high impedance by the first selection circuit included in the first scan line driver circuit while the row is selected by the second scan line driver circuit during the second row writing period wherein a second signal is inputted into the row through the second selection circuit from a second selection signal generating circuit provided in the second scan line driver circuit during the second row writing period.

14. A device according to claim 13, wherein the row selected by the first scan line driver circuit is different from the row selected by the second scan line driver circuit.

15. A device according to claim 13, wherein the selection circuit includes a tri-state gate.

16. An electronic appliance using the semiconductor display device according to claim 13.

17. A device according to claim 13 wherein the semiconductor display device is incorporated into one selected from the group consisting of a portable telephone and a camera.

18. A semiconductor display device comprising:
a pixel portion;
a signal line driver circuit;
a first scan line driver circuit; and
a second scan line driver circuit,
wherein the pixel portion includes a plurality of pixels disposed in rows and columns, which are respectively connected to the signal line driver circuit through signal lines and to the first scan line driver circuit and the second scan line driver circuit through scan lines;

each of the plurality of pixels comprises a light-emitting element, a switching transistor for controlling an input of a first video signal or a second video signal to the pixel, and a driving transistor for controlling a current supply to the light-emitting element;

the switching transistor included in each of the plurality of pixels is selected per row by the first scan line driver circuit;

the switching transistor included in each of the plurality of pixels is selected per row by the second scan line driver circuit;

writing of a first video signal to a row which has a switching transistor selected by the first scan line driver circuit is controlled by the signal line driver circuit;

writing of a second video signal to a row which has a switching transistor selected by the second scan line driver circuit is controlled by the signal line driver circuit;

a current supplied from the driving transistor to the light-emitting element is controlled by the first video signal or the second video signal;

the first scan line driver circuit includes a first selection circuit;

the second scan line driver circuit includes a second selection circuit;

a row writing period for inputting x video signals to x pixels provided in one row is divided into a first row writing period and a second row writing period where x is the number of pixels in one row;

an output from the second scan line driver circuit to the plurality of pixels is set at high impedance by the second selection circuit included in the second scan line driver circuit while the switching transistor included in each pixel is turned ON by the first scan line driver circuit during the first row writing period wherein a first signal is inputted into the row through the first selection circuit from a first selection signal generating circuit provided in the first scan line driver circuit during the first row writing period; and an output from the first scan line driver circuit to the plurality of pixels is set at high impedance by the first selection circuit included in the first scan line driver circuit while the switching transistor included in each pixel is turned ON by the second scan line driver circuit during the second row writing period wherein a second signal is inputted into the row through the second selection circuit from a second selection signal generating circuit provided in the second scan line driver circuit during the second row writing period.

19. A device according to claim 18, wherein the row which has the switching transistor turned ON by the first scan line driver circuit is different from the row which has the switching transistor turned ON by the second scan line driver circuit.

20. A device according to claim 18, wherein the selection circuit includes a tri-state gate.

21. An electronic appliance using the semiconductor display device according to claim 18.

22. A device according to claim 18 wherein the semiconductor display device is incorporated into one selected from the group consisting of a portable telephone and a camera.

* * * * *

UNITED STATES PATENT AND TRADEMARK OFFICE
CERTIFICATE OF CORRECTION

| | | |
|---|---|---|
| PATENT NO. | : 7,528,811 B2 | Page 1 of 1 |
| APPLICATION NO. | : 11/156920 | |
| DATED | : May 5, 2009 | |
| INVENTOR(S) | : Iwabuchi | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 904 days.

Signed and Sealed this
Tenth Day of May, 2011

David J. Kappos
*Director of the United States Patent and Trademark Office*